United States Patent
Kondo et al.

(10) Patent No.: US 10,353,041 B2
(45) Date of Patent: Jul. 16, 2019

(54) MRI APPARATUS AND A METHOD OF REDUCING IMAGING TIME

(71) Applicant: TOSHIBA MEDICAL SYSTEMS CORPORATION, Otawara-Shi (JP)

(72) Inventors: Hiroki Kondo, Nasushiobara (JP); Shinya Ozawa, Nasushiobara (JP); Masaaki Umeda, Sakura (JP); Yoshimori Kassai, Nasushiobara (JP); Naoyuki Takabayashi, Otawara (JP)

(73) Assignee: Toshiba Medical Systems Corporation, Otawara-Shi (JP)

( * ) Notice: Subject to any disclaimer, the term of this patent is extended or adjusted under 35 U.S.C. 154(b) by 409 days.

(21) Appl. No.: 15/065,397

(22) Filed: Mar. 9, 2016

(65) Prior Publication Data
US 2016/0274207 A1 Sep. 22, 2016

(30) Foreign Application Priority Data

Mar. 16, 2015 (JP) .................................. 2015-052534

(51) Int. Cl.
G01R 33/565 (2006.01)
G01R 33/561 (2006.01)

(52) U.S. Cl.
CPC . *G01R 33/56581* (2013.01); *G01R 33/56518* (2013.01); *G01R 33/5616* (2013.01); *G01R 33/5617* (2013.01)

(58) Field of Classification Search
None
See application file for complete search history.

(56) References Cited

U.S. PATENT DOCUMENTS

| 5,378,985 | A | * | 1/1995 | Hinks | G01R 33/56554 324/307 |
| 5,672,969 | A | * | 9/1997 | Zhou | G01R 33/56572 324/309 |
| 5,777,473 | A | * | 7/1998 | Takai | G01R 33/54 324/309 |
| 6,369,568 | B1 | | 4/2002 | Ma et al. | |
| 6,528,998 | B1 | * | 3/2003 | Zhou | G01R 33/56581 324/307 |
| 2009/0124885 | A1 | * | 5/2009 | Umeda | A61B 5/055 600/410 |

(Continued)

FOREIGN PATENT DOCUMENTS

| JP | 07-163544 A | 6/1995 |
| JP | 2001-025463 A | 1/2001 |
| JP | 2012-213608 A | 11/2012 |

*Primary Examiner* — Patrick Assouad
*Assistant Examiner* — Demetrius R Pretlow
(74) *Attorney, Agent, or Firm* — Oblon, McClelland, Maier & Neustadt, L.L.P.

(57) ABSTRACT

In one embodiment, an MRI apparatus, includes a static magnetic field magnet configured to generate a static magnetic field, a gradient coil configured to generate a gradient magnetic field, a transmission and reception coil configured to transmit an RF signal and receive a magnetic resonance signal, and processing circuitry. The processing circuitry determines whether or not a prescan for calculating a correction value that corrects a phase error is skippable or reducible based on an imaging condition of a main scan, and executes a scan including at least the main scan in accordance with a result of the determination.

13 Claims, 17 Drawing Sheets

(56) References Cited

U.S. PATENT DOCUMENTS

| | | | | |
|---|---|---|---|---|
| 2010/0094121 A1* | 4/2010 | Kuhara | ............... | A61B 5/055 600/413 |
| 2010/0286502 A1* | 11/2010 | Van Zijl | ............... | G01R 33/483 600/410 |
| 2011/0152669 A1* | 6/2011 | Kassai | ............... | A61B 5/055 600/413 |
| 2011/0291651 A1* | 12/2011 | Umeda | ............... | G01R 33/5617 324/307 |
| 2011/0291653 A1* | 12/2011 | Umeda | ............... | G01R 33/5617 324/309 |
| 2012/0032677 A1* | 2/2012 | Dannels | ............... | G01R 33/5659 324/309 |
| 2012/0249143 A1 | 10/2012 | Umeda | | |
| 2013/0063146 A1* | 3/2013 | Riederer | ............... | G01R 33/5611 324/309 |
| 2014/0239949 A1* | 8/2014 | Huang | ............... | G01R 33/543 324/307 |
| 2015/0157277 A1* | 6/2015 | Goto | ............... | A61B 5/721 600/413 |
| 2016/0038054 A1* | 2/2016 | Benner | ............... | A61B 5/055 600/413 |
| 2017/0135590 A1* | 5/2017 | Itagaki | ............... | A61B 5/0263 |

* cited by examiner

MRI APPARATUS AND A METHOD OF REDUCING IMAGING TIME

CROSS-REFERENCE TO RELATED APPLICATION

This application is based upon and claims the benefit of priority from Japanese Patent Application No. 2015-052534, filed on Mar. 16, 2015, the entire contents of which are incorporated herein by reference.

FIELD

Embodiments of the present invention relate to an MRI apparatus and a method of reducing imaging time.

BACKGROUND

Magnetic resonance imaging (MRI) apparatuses are configured to excite nuclear spins of an object placed in a static magnetic field with use of a radio frequency (RF) pulse having the Larmor frequency and to reconstruct magnetic resonance signals generated from the object with the excitation to thereby generate images. Unlike X-ray CT apparatuses and the like, the object is not exposed to radiation, so that diagnostic imaging can be performed in a less invasive manner.

The MRI apparatuses acquire an image by repeatedly applying an RF pulse and a gradient magnetic field to the object based on a pulse sequence. However, when the pulse sequence is executed, the magnetic field in an imaging space that houses the object is changed and causes generation of an eddy current. With the generation of the eddy current, a magnetic field different from the magnetic field set by the pulse sequence may be applied to the object. When the magnetic field being different from the magnetic field set by the pulse sequence is applied to the object, noise and sensitivity unevenness occur in acquired images, which may cause deterioration of image quality.

Accordingly, an MRI apparatus is provided which performs imaging (hereinafter referred to as a prescan) before performing imaging (hereinafter referred to as a main scan) that acquires an image for use in actual diagnostic imaging. The prescan is performed to acquire correction values for correcting a pulse sequence used in the main scan.

However, to acquire the correction values in the prescan, a pulse sequence that is same type to the pulse sequence used in the main scan needs to be executed in the prescan. Since one imaging action is constituted of a prescan and a main scan, the entire imaging time increases as execution of the prescan takes longer time.

DETAILED DESCRIPTION

Hereinafter, an MRI apparatus and a method of reducing imaging time of the present embodiment will be described with reference to accompanying drawings.

In one embodiment, an MRI apparatus, includes a static magnetic field magnet configured to generate a static magnetic field, a gradient coil configured to generate a gradient magnetic field, a transmission and reception coil configured to transmit an RF signal and receive a magnetic resonance signal, and processing circuitry. The processing circuitry determines whether or not a prescan for calculating a correction value that corrects a phase error is skippable or reducible based on an imaging condition of a main scan, and executes a scan including at least the main scan in accordance with a result of the determination.

(Overall Configuration)

Figure 1:
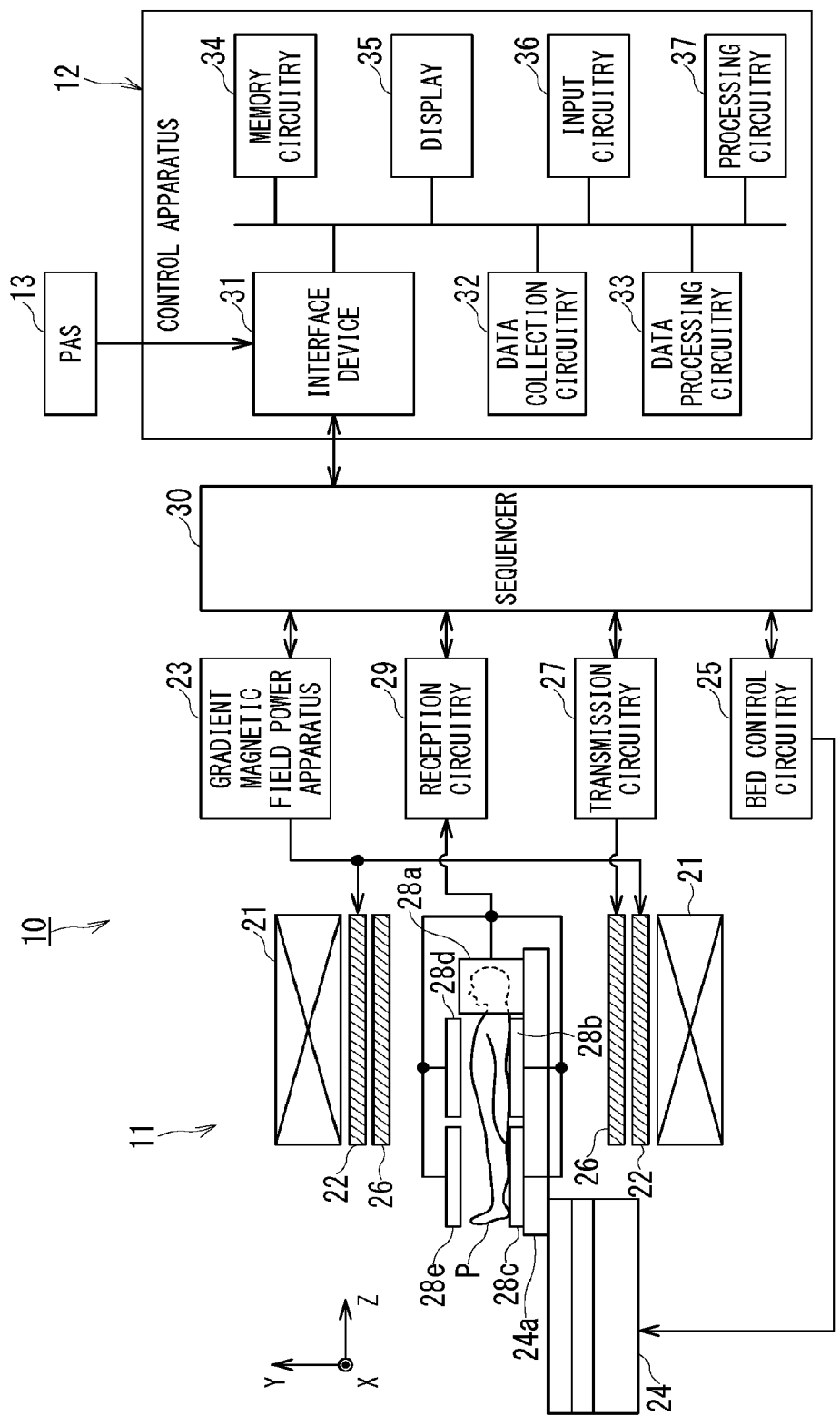
FIG. 1 is a schematic view illustrating a hardware configuration of an MRI apparatus.

FIG. 1 is a schematic view illustrating a hardware configuration of an MRI apparatus. The MRI apparatus 10 illustrated in FIG. 1 mainly includes an imaging apparatus 11 and a control apparatus 12.

The imaging apparatus 11 executes a main scan that is imaging for acquiring images actually used for diagnostic imaging and a prescan for acquiring correction values of an object before execution of the main scan. One imaging action is constituted of a prescan and a main scan. General prescans refer to scans as a whole which are performed prior to main scans for acquiring not only the correction values but also other parameters for positioning and generation of a sensitivity map necessary for the main scan. In the description of the present embodiment, the scans performed prior to each pulse sequence for acquiring correction values are referred to as prescans. More specifically, when a series of imaging is made up of a plurality of protocols, and each of the protocols (scans) executes a pulse sequence different from each other, scans executed prior to the respective protocols are referred to as prescans.

The control apparatus 12 is connected with a programmable anatomical scan (PAS) 13 via an electronic network. The PAS 13 is a database that stores pulse sequences corresponding to various anatomical regions and imaging methods. In the imaging in the MRI apparatus 10, out of such pulse sequences stored in the PAS 13, an appropriate pulse sequence is automatically or manually acquired, and imaging is performed based on the acquired pulse sequence.

The imaging apparatus 11 includes a static magnetic field magnet 21, a gradient magnetic field coil 22, a gradient magnetic field power apparatus 23, a bed 24, bed control circuitry 25, a transmission coil 26, transmission circuitry 27, reception coils 28a to 28e, reception circuitry 29, and a sequencer (sequence controller) 30.

The static magnetic field magnet 21 is formed into a hollow cylindrical shape on the outermost portion of a mount (not illustrated) to generate a uniform static magnetic field in an internal space of the hollow cylinder. Examples of the static magnetic field magnet 21 include a permanent magnet or a superconducting magnet.

The gradient magnetic field coil 22 is formed into a hollow cylindrical shape and is arranged inside the static magnetic field magnet 21. The gradient magnetic field coil 22 is formed from a combination of coils each corresponding to X, Y, and Z axes which are orthogonal to each other. Three coils individually receive current supply from a gradient magnetic field power apparatus 23 and generate gradient magnetic fields where the intensities of the magnetic fields vary along each of X, Y, and Z axes. The gradient magnetic field power apparatus 23 supplies current to the gradient magnetic field coil 22 based on pulse sequence execution data sent from the sequencer 30.

The gradient magnetic fields generated by the gradient magnetic field coil 22 includes a gradient magnetic field Gr for readout, a gradient magnetic field Ge for phase encoding, and a gradient magnetic field Gs for slice selection. The gradient magnetic field Gr for readout is used to change the frequency of an MR signal in accordance with a spatial location. The gradient magnetic field Ge for phase encoding is used to change the phase of an MR signal in accordance with the spatial location. The gradient magnetic field Gs for slice selection is used to arbitrarily determine an imaging cross section. For example, in the case of acquiring axial tomographic slices, X, Y, and Z axes illustrated in FIG. 1 are made to correspond to the gradient magnetic field Gr for readout, the gradient magnetic field Ge for phase encoding, and the gradient magnetic field Gs for slice selection, respectively.

The bed 24 includes a top plate 24a to lay the object P thereon. Under the control of the later-described bed control circuitry 25, the top plate 24a of the bed 24 is inserted into the hollow (imaging port) of the gradient magnetic field coil 22 with the object P being laid thereon. The bed 24 is generally arranged so that its longitudinal direction is parallel to a central axis of the static magnetic field magnet 21.

Under the control of the sequencer 30, the bed control circuitry 25 drives the bed 24 so as to move the top plate 24a in a longitudinal direction and in a vertical direction.

The transmission coil 26 is arranged inside the gradient magnetic field coil 22 to receive a radio frequency (RF) pulse from the transmission circuitry 27 to generate an RF magnetic field. The transmission coil 26 is also used as a reception coil, and is also called an RF coil for whole body.

The transmission circuitry 27 transmits an RF pulse corresponding to the Larmor frequency to the transmission coil 26 based on the pulse sequence execution data sent from the sequencer 30.

The reception coils 28a to 28e are arranged inside the gradient magnetic field coil 22 to receive an MR signal radiated from the object P under the influence of the RF magnetic field. The reception coils 28a to 28e are array coils each having a plurality of element coils which receive MR signals emitted from the object P. Upon reception of the MR signals with the respective element coils, the received MR signals are output to the reception circuitry 29.

The reception coil 28a is a head coil mounted on the head of the object P. The reception coils 28b and 28c are backbone coils each arranged between the back of the object P and the top plate 24a. The reception coils 28d and 28e are abdominal coils each mounted on the abdominal side of the object P. The MRI apparatus 10 may include a coil for use in both transmission and reception.

The pulse sequence execution data sent from the sequencer 30 and control the reception coils 28a to 28e. The reception circuitry 29 generates MR signal data based on the MR signals output from the reception coils 28a to 28e. Upon generation of the MR signal data, the reception circuitry 29 transmits the MR signal data to the control apparatus 12 via the sequencer 30.

The reception circuitry 29 has a plurality of receiving channels configured to receive the MR signals output from a plurality of the element coils included in the reception coils 28a to 28e. When an element coil to be used for imaging is notified from the control apparatus 12, the reception circuitry 29 allocates a receiving channel to the notified element coil so as to receive the MR signal output from the notified element coil.

The sequencer 30 is connected to the gradient magnetic field power apparatus 23, the bed control circuitry 25, the transmission circuitry 27, the reception circuitry 29, and the control apparatus 12. The sequencer 30 includes processors which are not illustrated, such as a central processing unit (CPU) and a memory. The sequencer 30 stores pulse sequence execution data describing control information which is necessary for driving the gradient magnetic field power apparatus 23, the bed control circuitry 25, the transmission circuitry 27, and the reception circuitry 29. For example, the control information is motion control information such as intensity, application time, and application timing of pulse current to be applied to the gradient magnetic field power apparatus 23.

The sequencer 30 also drives the bed control circuitry 25 in accordance with the stored specified pulse sequence so as to move the top plate 24a back and forth relative to the mount in Z direction. The sequencer 30 further drives the gradient magnetic field power apparatus 23, the transmission circuitry 27, and the reception circuitry 29 in accordance with the stored specified pulse sequence so as to generate a gradient magnetic field inside the mount. The gradient magnetic fields include the gradient magnetic field Gr for readout, the gradient magnetic field Ge for phase encoding, and the gradient magnetic field Gs for slice selection. The gradient magnetic field Gr for readout is used to change the frequency of an MR signal in accordance with the spatial location. The gradient magnetic field Ge for phase encoding is used to change the phase of the MR signal in accordance with the spatial location. The gradient magnetic field Gs for slice selection is used to arbitrarily determine an imaging cross section. For example, in the case of acquiring axial tomographic slices, X, Y, and Z axes illustrated in FIG. 1 are made to correspond to the gradient magnetic field Gr for readout, the gradient magnetic field Ge for phase encoding, and the gradient magnetic field Gs for slice selection, respectively.

The control apparatus 12 performs control on the entire MRI apparatus 10, as well as data collection, image reconstruction and the like. The control apparatus 12 has an interface device 31, data collection circuitry 32, data processing circuitry 33, memory circuitry 34, a display 35, input circuitry 36, and processing circuitry 37.

The interface device 31 is connected to the gradient magnetic field power apparatus 23, the bed control circuitry 25, the transmission circuitry 27, and the reception circuitry 29 of the imaging apparatus 11 via the sequencer 30. The interface device 31 controls input/output of the signals delivered and received between each apparatus of the connected circuitry and the control apparatus 12.

The data collection circuitry 32 collects the MR signal data transmitted from the reception circuitry 29 via the interface device 31. The data collection circuitry 32 collects the MR signal data and stores the collected MR signal data in the memory circuitry 34.

The data processing circuitry 33 performs post-processing, i.e., reconfiguration processing such as the Fourier transform, on the MR signal data stored in the memory circuitry 34 so as to generate spectrum data or image data of desired nuclear spins inside the object P. In the case of imaging a positioning image, the data processing circuitry 33 generates, based on the MR signals received in each of a plurality of the element coils included in the reception coils 28a to 28e, profile data indicating MR signal distribution in an array direction of the element coils for each of the element coils. The data processing circuitry 33 then stores the generated various data in the memory circuitry 34.

The memory circuitry 34 stores data, such as the MR signal data collected by the data collection circuitry 32 and the image data generated by the data processing circuitry 33, for each object P.

The display 35 displays various kinds of information, including the spectrum data or image data generated by the data processing circuitry 33. As the display 35, display devices such as liquid crystal displays may be used.

The input circuitry 36 receives various operations and information inputs from an operator. As the input circuitry 36, a pointing device such as a mouse and a trackball, a selector device such as a mode selector switch, or an input device such as a keyboard, can suitably be used.

The processing circuitry 37 has a processor and a memory which are not illustrated to control the aforementioned each circuitry to comprehensively control the MRI apparatus 10.

Figure 2:
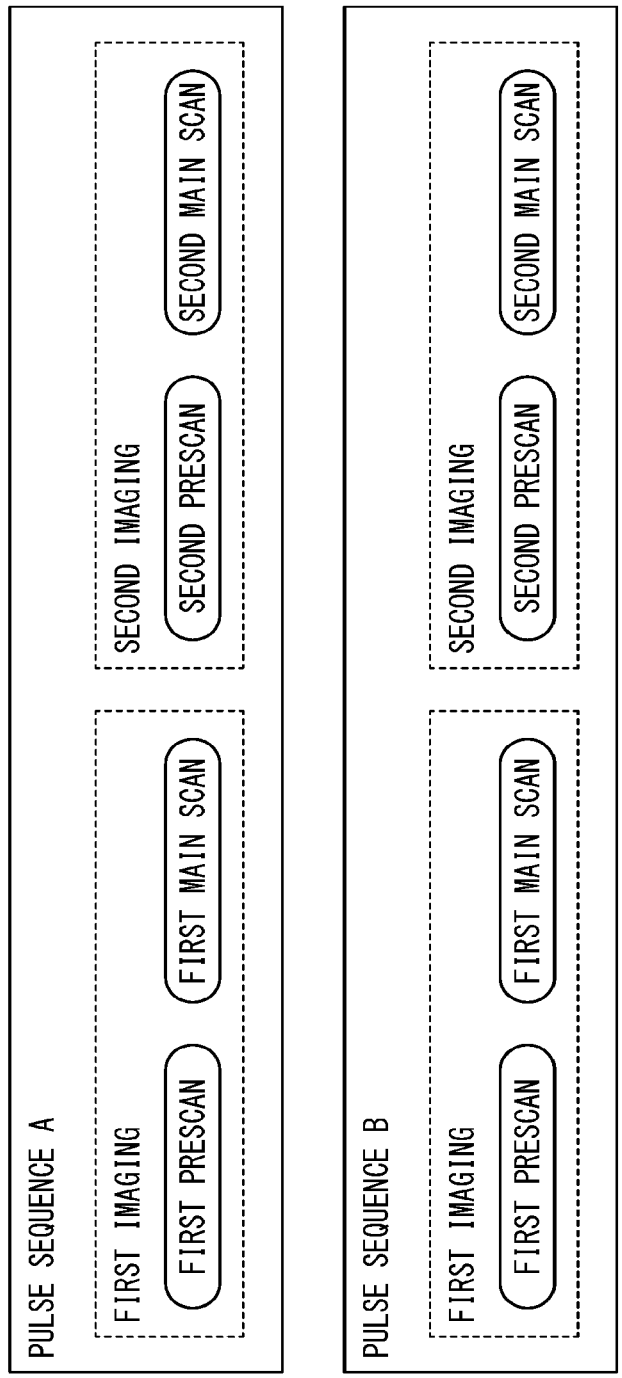
FIG. 2 is an explanatory view illustrating first imaging and second imaging, as well as a prescan and a main scan.

FIG. 2 is an explanatory view illustrating first imaging and second imaging, as well as a prescan and a main scan. There are various types of pulse sequence corresponding to imaging regions or imaging methods. As illustrated in FIG. 2, when a pulse sequence A and a pulse sequence B are present, first imaging and second imaging are present for the pulse sequences of the respective types. Here, "first imaging" is imaging performed at least once after system installation. It is not mandatory to perform the first imaging on a patient. For example, the first imaging may be performed on a phantom. "Second imaging" is clinical imaging executed after the first imaging. Whenever imaging of an object (patient) is performed, the second imaging is executed.

In each of the first imaging and the second imaging, one imaging is constituted of "prescan" and "main scan." Although the prescan uses a pulse sequence of the same type as in the main scan, the setting of pulse sequence used in the prescan is slightly different from the setting of pulse sequence actually used in the main scan. For example, the phase encoding value is set to zero in accordance with a correction value to be acquired in the prescan. Hereinbelow, a prescan executed in first imaging and a prescan executed in second imaging are referred to as "a first prescan" and "a second prescan", respectively. A main scan executed in the first imaging and a main scan executed in the second imaging are referred to as "first main scan" and "second main scan", respectively.

While the first prescan in the first imaging is mandatory, the first main scan is performed as necessary and may be skipped.

The MRI apparatus 10 according to the present embodiment can reduce the entire second imaging time by skipping the second prescan, or by reducing the time of the second prescan based on magnitude relation of correction values acquired in the first prescan and on a difference between imaging conditions of the first imaging and imaging conditions of the second imaging.

Hereinbelow, first to fourth embodiments of the present invention will be described. The first embodiment is configured to determine a method of skipping the second prescan or reducing the time of the second prescan based on the magnitude relation of the correction values acquired in the first prescan. In addition to the first embodiment, the second embodiment is configured to determine a method of skipping the second prescan or reducing the time of the second prescan based on similarity of imaging conditions in the second imaging. In addition to the second embodiment, the third embodiment is configured to determine magnitude relation of the correction values acquired in the second prescan and to store the magnitude relation together with a changed imaging condition. In the fourth embodiment, an imaging condition parameter set for clinical imaging (second imaging) is compared with a predefined determination criterion, and whether to omit the second prescan or not is determined based on the comparison result regardless of the magnitude relation of the correction values.

First Embodiment

The first embodiment relates to determination of a method of reducing the time of a second prescan based on the magnitude relation of correction values acquired in the first prescan.

(1) Configuration

Figure 3:
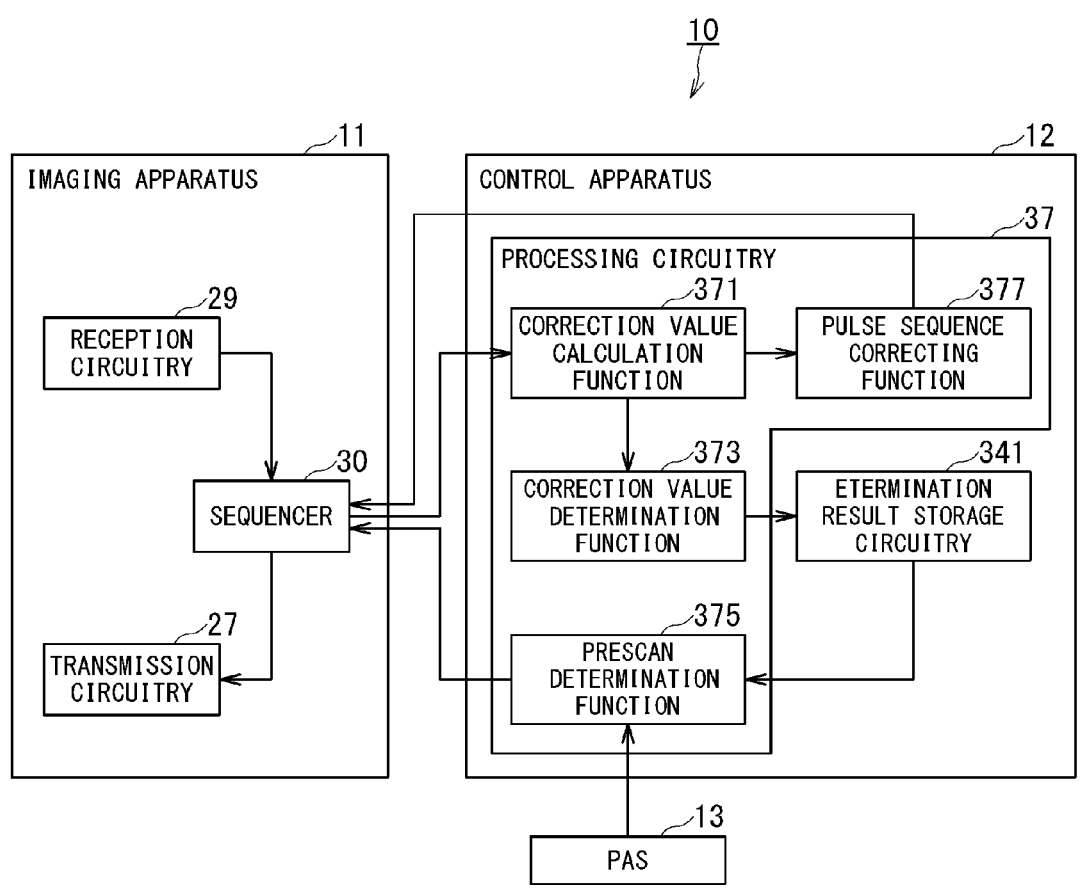
FIG. 3 is a functional block diagram illustrating a functional configuration example of an MRI apparatus according to the first embodiment.

FIG. 3 is a functional block diagram illustrating a functional configuration example of an MRI apparatus 10 according to the first embodiment. As illustrated in FIG. 3, the control apparatus 12 includes a correction value calculation function 371, a correction value determination function 373, a prescan determination function 375, a pulse sequence correcting function 377, and determination result storage circuitry 341. Among these functions, the correction value calculation function 371, the correction value determination function 373, and the prescan determination function 375 are implemented when programs stored in the memory circuitry 34 are executed by the processing circuitry 37 that includes a processor.

The correction value calculation function 371 calculates a plurality of correction values based on MR signals acquired in the prescan. The correction value calculation function 371 calculates, for example, a zero-order phase error in the readout direction, a first-order phase error in the readout direction, and a first-order phase error in the slice direction. Here, the zero-order phase error is a fixed phase error independent of spatial positions. The first-order phase error changes depending on the spatial positions. To be more specific, the first-order phase error changes based on a linear function relating to spatial positions. The correction values are calculated based on these phase errors. Methods of calculating the phase errors and corrections value in the correction value calculation function 371 will be described later.

The correction value determination function 373 determines, for each type of calculated correction value, whether the correction value is larger or smaller than a specified threshold, and generates a correction value determination result. For example, the correction value determination result may be expressed with binary digits of "1" or "0" arrayed in association with each type of correction value. The digit "1" may indicate that one type of correction value is larger than a threshold value, and the digit "0" may indicate that one type of correction value is smaller than the threshold value. When three types of correction values are acquired, they are expressed by three binary digits.

The determination result storage circuitry 341 stores correction value determination results.

The prescan determination function 375 determines whether or not a second prescan in the second imaging performed after the first imaging is reducible based on the correction value determination results of the first imaging. For example, when the calculated determination results of all the correction values are smaller than thresholds, the second prescan can be shortened by skipping the second prescan. The types of the second prescan and a method for determination will be described later.

The pulse sequence correcting function 377 corrects a pulse sequence based on the correction values calculated in the correction value calculation function 371. A method of correcting the pulse sequence will be described later.

(2) Operation

Figure 4:
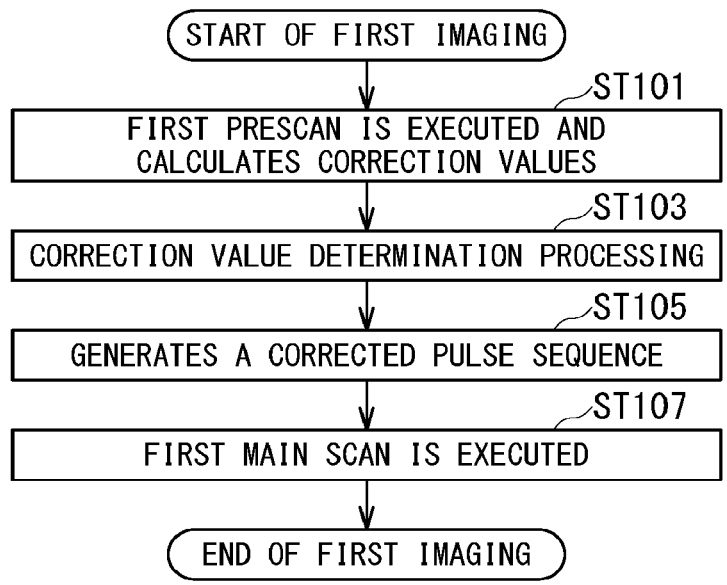
FIG. 4 is a flow chart of the first imaging as one example of operation of the MRI apparatus according to the first embodiment.

FIG. 4 is a flow chart of the first imaging as one example of operation of the MRI apparatus 10 according to the first embodiment.

In ST101, a first prescan is executed in the imaging apparatus 11, and the correction value calculation function 371 calculates correction values. The first prescan is performed with the same type of pulse sequence executed in the first main scan.

For example, in the pulse sequences for acquiring a plurality of MR signals in one excitation, such as fast spin echo (FSE) pulse sequences and echo planar imaging (EPI) pulse sequences, a phase shift generated in transverse magnetization causes noise and artifacts. In these pulse sequences, gradient magnetic fields are successively changed a plurality of times and a plurality of RF pulses are successively radiated since a plurality of MR signals are acquired in one excitation. Accordingly, once a phase shift is generated, it tends to be accumulated or amplified. Generation of such a phase shift is attributed to a difference between a magnetic field actually applied to an object and a magnetic field designed in the pulse sequence, the difference being caused by the influence of a magnetic field generated by an eddy current.

Hereinafter, the reason why the phase shift is caused by generation of an eddy current is described by using a fast spin echo pulse sequence as an example.

Figure 5:
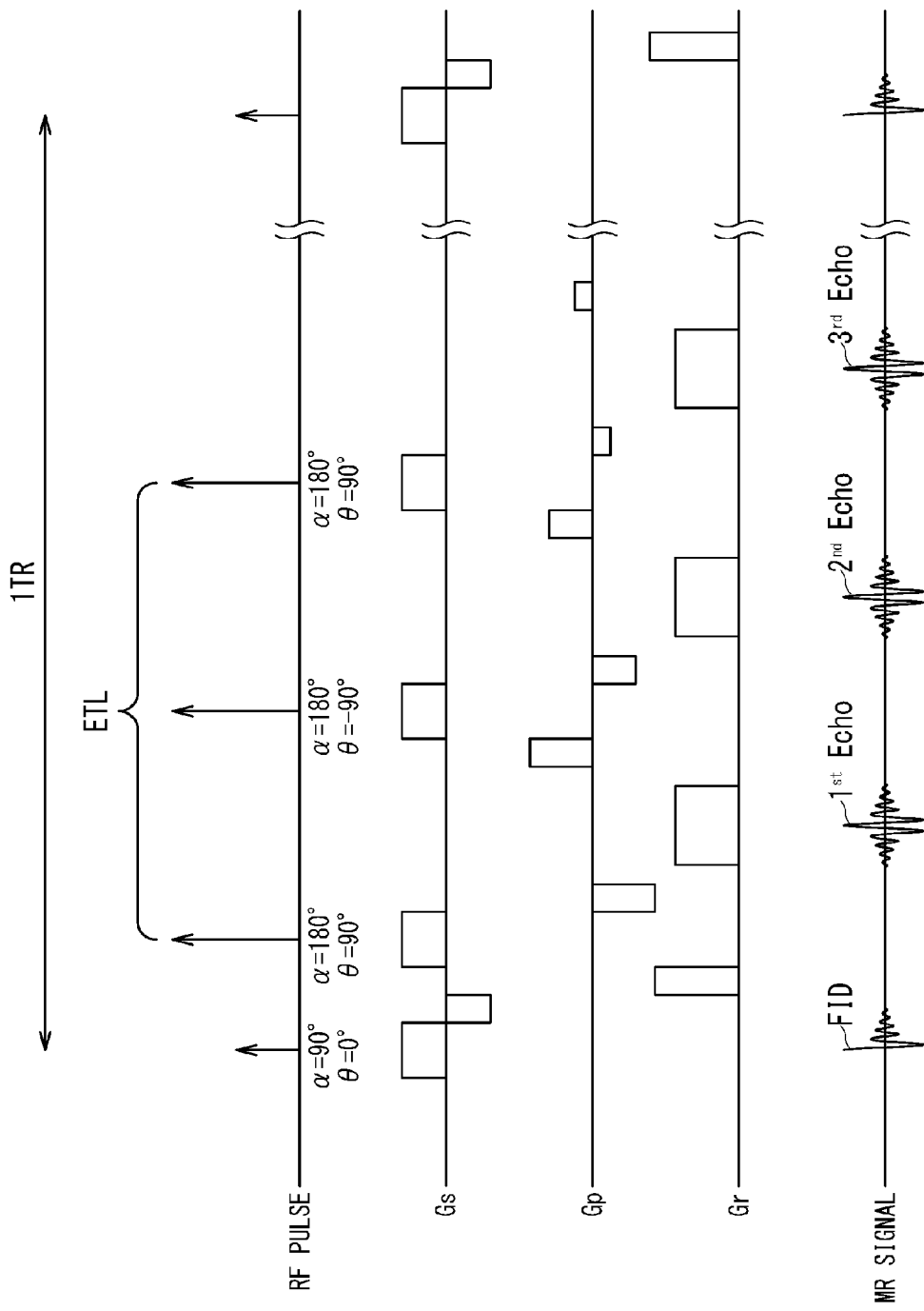
FIG. 5 is an explanatory view of an example of the fast spin echo method pulse sequence.

FIG. 5 is an explanatory view of an example of the fast spin echo method pulse sequence. FIG. 5 is a time chart of an FSE pulse sequence. FIG. 5 illustrates an RF pulse, a gradient magnetic field for slice selection (Gs), a gradient magnetic field for phase encoding (Gp), a gradient magnetic field for readout (Gr), and an MR signal in this order from the above.

As illustrated in FIG. 5, in the FSE pulse sequence, nuclear spins of an object are excited by an RF pulse (hereinafter referred to as a 90-degree pulse) that inverts the nuclear spins 90 degrees. The inversion of a nuclear spin generated by an RF pulse in this way is called a flip angle. In FIG. 5, α denotes a flip angle, and θ denotes a phase of a 90-degree pulse RF signal. The RF pulse inverts the nuclear spin and thereby triggers transverse magnetization. A period of time until a next 90-degree pulse is applied is defined as 1 repetition time (TR). During 1 TR between application of one 90-degree pulse to application of a next 90-degree pulse, a plurality of MR signals are acquired. In the example of FIG. 5, three MR signals (1stEcho, 2ndEcho, 3rdEcho) are acquired. After a refocusing pulse with a flip angle of 180 degrees (hereinafter referred to as a 180-degree pulse) is applied, an MR signal is acquired while the gradient magnetic field for readout is applied. In the example of FIG. 5, a plurality of 180-degree pulses are applied during 1 TR for one slice. The number of a plurality of 180-degree pulses after one 90-degree pulse is referred to as an echo train length (ETL).

As in the case of 90-degree pulse, the 180-degree pulse is also expressed with a flip angle (α) and an RF signal phase (θ). In first and third 180-degree pulses, α is 180 degrees and θ is 90 degrees. In a second 180-degree pulse, α is 180 degrees and θ is −90 degrees. Such a method of alternately changing the phase is called a CPMG (Carr-Purcell-Meiboom-Gill) technique. More specifically, when a 180-degree pulse is applied to a nucleus, which is spinning on an x'y' plane due to the 90-degree pulse, the nucleus is made to spin around y' axis. If the phase of the 180-degree pulse is changed to 90 degrees and −90 degrees, the center of the spin is changed to y' axis and −y' axis. By alternately inverting the spin center, accumulation of phase inversion errors is suppressed.

The MR signals can be acquired for a plurality of slices by executing the pulse sequence illustrated in FIG. 5 in every TR while changing the slice to be selected. MR signals may also be collected for a plurality of slices by the next TR if a multislice scan is performed.

The pulse sequence is planned so that a peak of an MR signal coincides with the center of the gradient magnetic field for readout. The MR signal demonstrates a peak value when dephasing of transverse magnetization is refocused.

Figure 6:
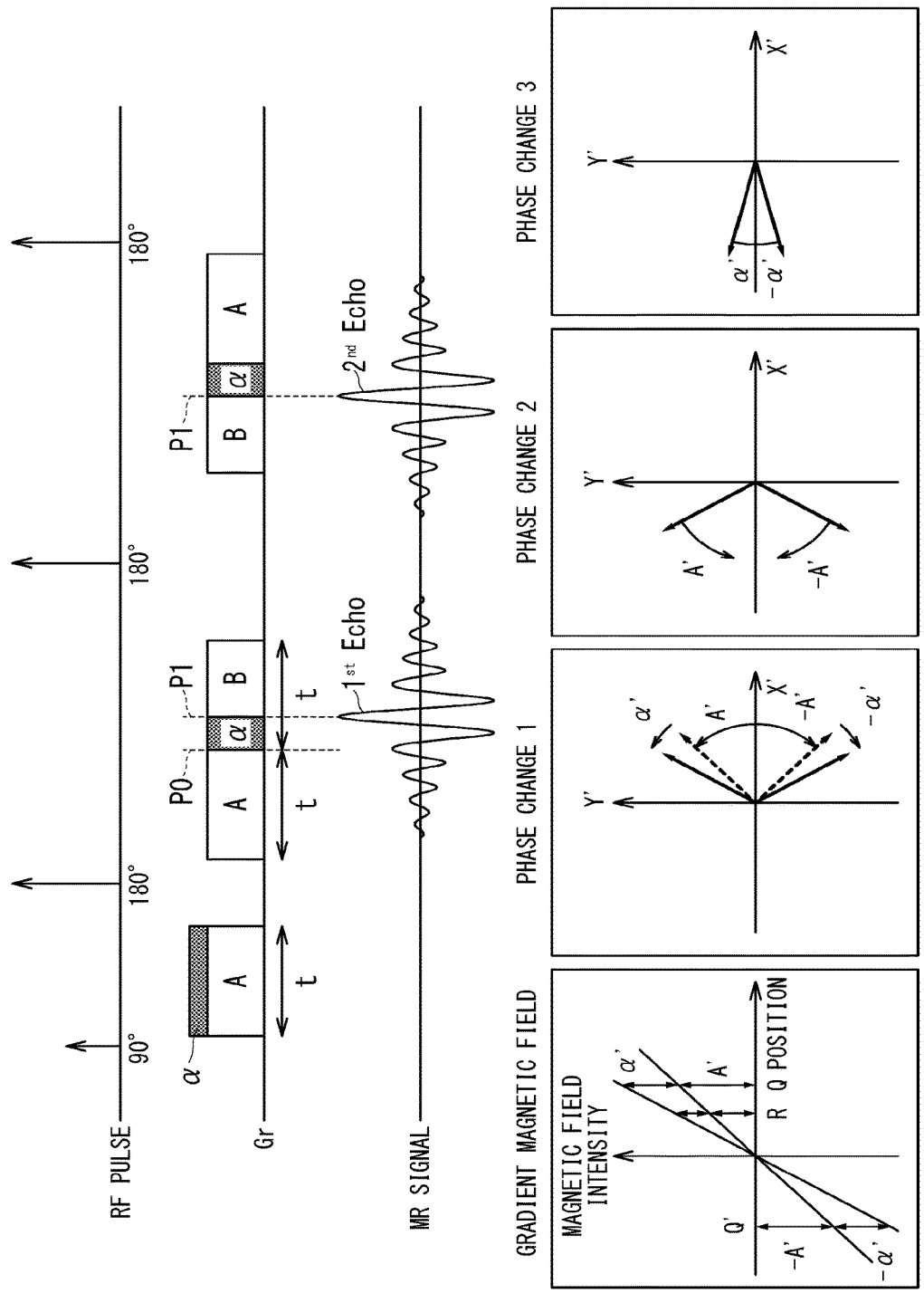
FIG. 6 is an explanatory view of phase change in the pulse sequence.

FIG. 6 is an explanatory view of phase change in the pulse sequence. In an upper portion of FIG. 6, the time chart of the FSE pulse sequence described in FIG. 5 is partially illustrated. The time chart includes an RF pulse, a gradient magnetic field for readout (Gr), and an MR signal in this order from the above. The gradient magnetic fields illustrated in FIG. 6 are each illustrated as an area expressed as a product of gradient magnetic field intensity and application time. In the time chart, t denotes time and "A" denotes the area of a gradient magnetic field for readout (hereinafter referred to as a gradient magnetic field for compensation), which is applied immediately after application of a 90-degree pulse. In this case, the MR signal has a peak at the time when the area of a gradient magnetic field (hereinafter referred to as a gradient magnetic field for readout) after application of a 180-degree pulse becomes equal to the area of the gradient magnetic field for compensation. In FIG. 6, a broken line P0 represents a peak position of the MR signal designed in the pulse sequence. For example, although the gradient magnetic field for compensation "A" is intended to be applied, a magnetic field of "A+α" may be applied in actuality due to application of an additional magnetic field of "α" generated by influence of an eddy current and the like. In this case, a peak of the MR signal cannot be detected at assumed time. As illustrated in FIG. 6, when the area of the gradient magnetic field for compensation is "A+α", a peak of the MR signal in the 1stEcho is observed at a position after the gradient magnetic field of "A+α" is applied as indicated with a broken line P1. In FIG. 6, an unnecessary magnetic field "α" caused by an eddy current and the like is applied simultaneously with the gradient magnetic field for compensation "A". However, peak shift of the MR signal is not limited to this example. When an unnecessary magnetic field which is equivalent to the area "α" is applied in addition to the assumed gradient magnetic field for compensation "A" at arbitrary time between the 90-degree pulse and the first 180-degree pulse, the peak of the MR signal in the 1stEcho is shifted from "P0" representing the center of the gradient magnetic field for readout as an original position to the position "P1". In this example of FIG. 6, the peak of the MR signal is shifted backward from the original position. In the 2ndEcho after application of the second 180-degree pulse, the peak of the MR signal is observed when a gradient magnetic field equal to an area "B" of the latter half portion of the gradient magnetic field for readout is applied after the peak of the 1stEcho. Therefore, the peak of the MR signal is observed at the position after the gradient magnetic field of the area "B" is applied as indicated by the broken line P1. In this example of FIG. 6, the peak of the MR signal shifts forward from the original position.

Lower graphs in FIG. 6 illustrate the aforementioned phenomenon from a viewpoint of phase change in transverse magnetization. In a lower leftmost graph in FIG. 6, the horizontal axis represents a position in the readout direction, and the vertical axis represents a magnetic field intensity. In this graph, when a gradient magnetic field for compensation "A'" is applied, an additional magnetic field "a'" is also applied to certain positions Q and Q' which are under the influence of an eddy current. As a result, the intensity of the magnetic field "α'" is added to the intensity of the original magnetic field "A'."

A second graph (phase change 1) from the lower leftmost graph in FIG. 6 schematically illustrates rotation of the phase of transverse magnetization generated by a 90-degree pulse at the positions Q and Q'. Upon application of a gradient magnetic field for compensation, the phase of the transverse magnetization rotates on the X'Y' plane with X' axis as a start point. When the applied gradient magnetic field for compensation has a magnetic field intensity of A', the phase rotates by an arrow A'. However, when the magnetic field intensity of α' is added due to an eddy current, the phase additionally rotates (disperses) by an arrow α'.

A third graph (phase change 2) from the lower leftmost graph in FIG. 6 illustrates the rotation of the phase immediately after application of a 180-degree pulse. The phase of the transverse magnetization is made to rotate around Y' axis by the 180-degree pulse. Then, a gradient magnetic field for readout is applied, so that the phase rotates in a direction of A'. The pulse sequence is originally designed so that the peak of the MR signal is observed at the time when the phase rotates in the direction of A'. More specifically, at the moment when the phase rotates in the direction of A', dephasing is refocused and the peak of the MR signal is observed. However, as illustrated in a lower rightmost graph (phase change 3) of FIG. 6, since the phase of the transverse magnetization is at a position offset by the phase of α' generated by the eddy current, the MR signal does not yet reach its peak at this moment. More specifically, as illustrated in the upper portion of FIG. 6, the MR signal reaches its peak later by the magnetic field intensity generated by the eddy current. In the next 2ndEcho, a magnetic field "B" smaller in area by a portion α is applied, which decreases the amount of phase rotation of the transverse magnetization after dephasing is refocused, so that the MR signal reaches its peak earlier in the 2ndEcho. The aforementioned phase shift also applies to the position Q'.

Thus, in the FSE pulse sequence, when the area of the gradient magnetic field between a 90-degree pulse and a first 180-degree pulse does not match with a half of the area of the gradient magnetic field area between each 180-degree pulse due to the influence of unnecessary magnetic fields caused by an eddy current and the like, the peak position of an even-numbered echo and the peak position of an odd-numbered echo are alternately deviated from each other. As a result, the intensity of the MR signal in the phase encoding direction fluctuates, leading to generation of artifacts such as ghost.

The phase shift described in the foregoing is a phase shift generated depending on (in proportion to) spatial positions, i.e., a first-order phase error in the readout direction. That is, a phase error becomes larger in a positive direction and in a negative direction as a distance to the center of the magnetic field in the readout direction is longer. For example, in comparison between a point R and a point Q in the lower leftmost graph of FIG. 6, the point Q is affected by the eddy current more than the point R is, and thus a phase shift caused by the eddy current is also proportionally larger at the point Q.

In addition to such a first-order phase error in the readout direction, there are errors such as a zero-order phase error in the readout direction independent of spatial positions, a first-order phase error in the phase encoding direction, and a first-order phase error in the slice direction.

In the foregoing description an example of one gradient magnetic field which is influenced by an eddy current is described for easy understanding. However, in actual imaging, other gradient magnetic fields are also influenced by the eddy current. That is, the eddy current also exerts an influence at the time of applying a gradient magnetic field for slice selection, a 90-degree pulse, and the like. As a result, the obtained phase becomes different from the phase assumed in each pulse which is set in the pulse sequence, resulting in generation of noise and artifacts in the MR signal.

As illustrated in FIG. 6, when the echo center of an MR signal is deviated due to the influence of the eddy current, an obtained signal becomes smaller or larger than an assumed signal. When the signal becomes smaller, an S/N ratio decreases. As described before, when the peak positions of even-numbered and odd-numbered echoes are periodically shifted, the signal intensity in the phase encoding direction also periodically fluctuates, resulting in occurrence of ghost in a reconstructed image.

Although a slice thickness is determined by the magnetic field intensity of the gradient magnetic field for slice selection, a slice which is different from an assumed one is excited under the influence of the eddy current. Since such a phase shift in the slice direction varies depending on slice positions, it is called a first-order phase error in the slice direction which depends on positions.

In the prescan, these phase errors are detected and a correction amount is calculated from each of the detected phase errors. In the main scan, the pulse sequence is partially corrected so as to offset the phase errors with use of the calculated correction amount, and imaging is executed by using the corrected pulse sequence.

Hereinafter, a method of calculating a correction value for correcting a phase error is described. A correction value for correcting the zero-order phase error in the readout direction is called "angle offset (AO)." A correction value for correcting the first-order phase error in the slice direction is called "deltaT (DT)". A correction value for correcting the first-order phase error in the readout direction is called "tuneF (TF)".

When the MRI apparatus 10 according to the embodiment performs, for example, FSE imaging as illustrated in FIG. 5, the pulse sequence illustrated in FIG. 5 is executed in the prescan. For example, the 1stEcho and the 2ndEcho of FIG. 5 are measured in the state where the gradient magnetic field for phase encoding is not applied, and a correction value is calculated from a phase error between these MR signals. The method of calculating a correction value also include: a method in which measurement is performed while the gradient magnetic field for phase encoding is applied; and a method of calculating a correction value from a difference between the 3rdEcho and the 4thEcho. The method described below is merely an example of the method of calculating the correction value.

Figure 7:
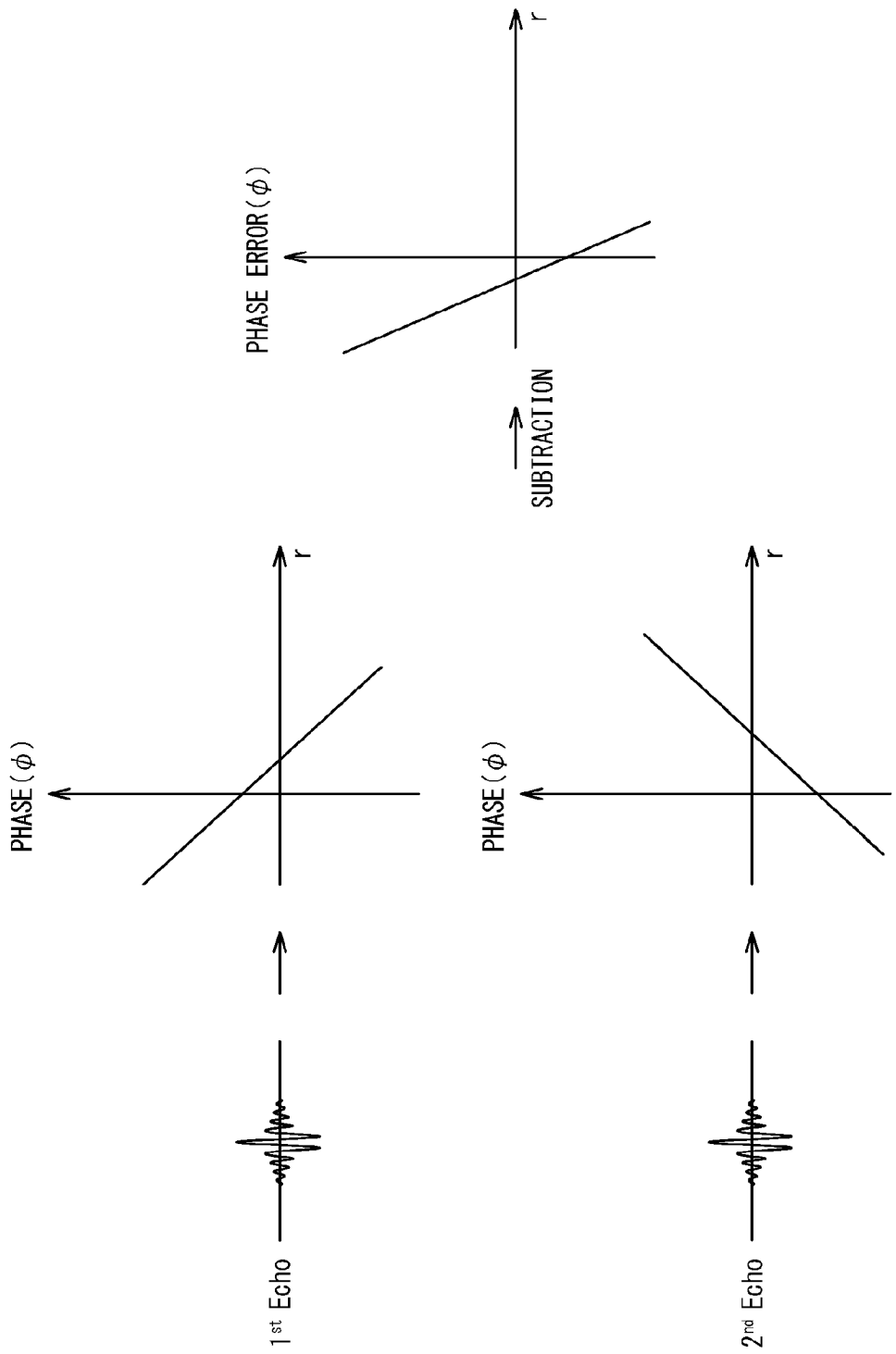
FIG. 7 is an explanatory view of one example of the method of calculating a correction value.

FIG. 7 is an explanatory view of one example of the method of calculating a correction value. In middle graphs of FIG. 7, the vertical axis represents a phase (φ), and the horizontal axis represents a position (r) in the readout direction. An upper left chart in FIG. 7 illustrates the 1stEcho of FIG. 5, and a lower left chart illustrates the 2ndEcho. The middle graphs in FIG. 7 each illustrates the phases of values (complex numbers) which are obtained by performing one-dimensional fast Fourier transform of each of the 1stEcho and the 2Echo and are plotted relative to the position (r) in the readout direction. Specifically, the phases φ are calculated from a following expression (1), where R is a real part and I is an imaginary part of the complex number after the Fourier transform:

[Expression 1]

$$\phi = \arctan\frac{I}{R} \quad (1)$$

A right graph in FIG. 7 illustrates a difference between the graphs calculated from the 1stEcho and the 2ndEcho. A first-order phase error in the readout direction (TF) and a zero-order phase error in the readout direction (AO) can be calculated from inclination of a straight line and an intercept (value of the straight line when r=0) illustrated in the right graph of FIG. 7, respectively.

In the pulse sequence described in FIG. 5, MR signals can be acquired for a plurality of slices. For each of the slices, a first-order phase error in the readout direction is calculated by the method of illustrated in FIG. 7, and a zero-order phase error or AO in each of the slices is simultaneously acquired for each slice. Although TF that is a correction value for the first-order phase error in the readout direction may be calculated for each slice and may be retained for each slice, TF of each of the slices may be integrated into one TF, and this integrated TF may be retained. In this case, a plurality of TFs calculated for each of the slices may be weighted and averaged in proportion to the size of a signal value of each slice, and a resultant TF may be retained as an integrated TF.

Figure 8:
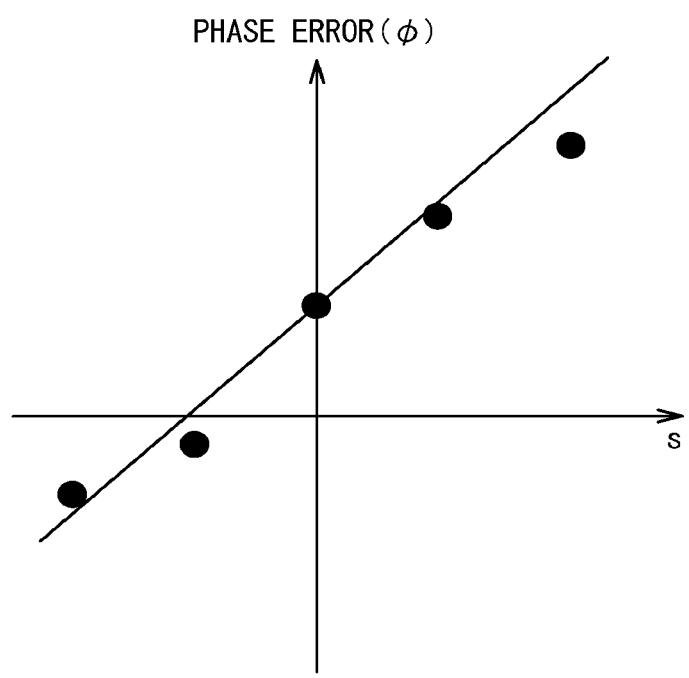
FIG. 8 is an explanatory view of one example of a method of calculating the correction value.

A correction value DT for correcting the first-order phase error in the slice direction can be calculated from the correction value AO of the zero-order phase error acquired for each slice. FIG. 8 is an explanatory view of one example of a method of calculating the correction value DT.

In the graph of FIG. 8, the vertical axis represents phase error (φ) and the horizontal axis represents position (s) in the slice direction. Black dots illustrated in FIG. 8 are correction values AO of the zero-order phase errors acquired for each slice, the correction values AO being plotted corresponding to slice positions. An approximation straight line (linear function) is obtained from the positions of the respective black dots, and the inclination thereof is used as a correction value DT for correcting the first-order phase error in the slice direction.

With the methods described before, the correction value for correcting the phase error generated by an eddy current can be calculated. A description is now given of a method of correcting a pulse sequence with the calculated correction value.

Figure 9:
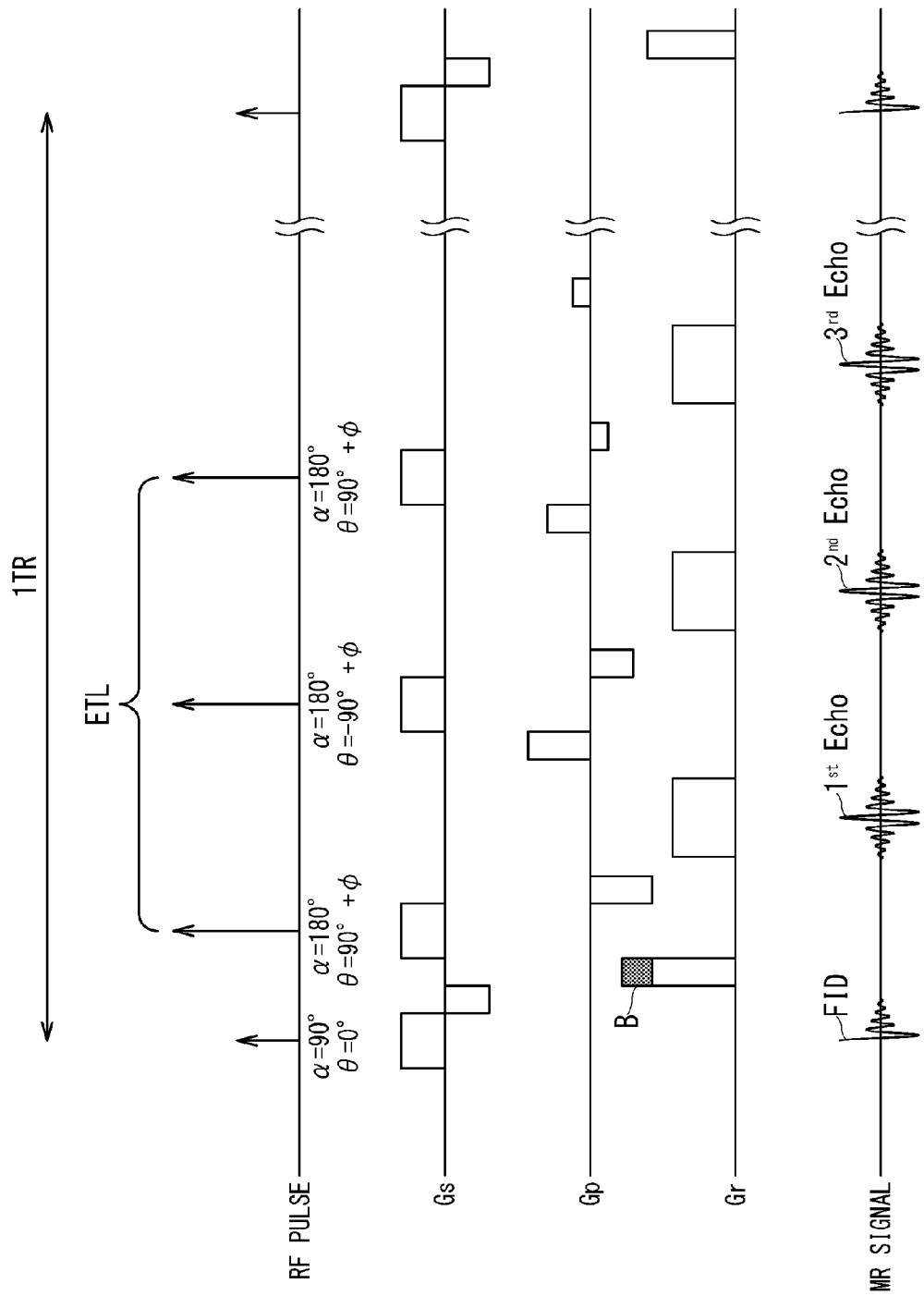
FIG. 9 is an explanatory view of one example of the method of correcting the pulse sequence with the correction value

FIG. 9 is an explanatory view of one example of the method of correcting the pulse sequence with the correction value. In FIG. 9, the method of correcting the pulse sequence illustrated in FIG. 5 is described as an example.

Phase correction based on the correction value (AO) corresponding to a zero-order phase error in the readout direction and on the correction value (DT) corresponding to a first-order phase error in the slice direction is performed by calculating a phase error (φ) based on the linear function illustrated in FIG. 8 and relatively changing a phase difference (θ) between a 90-degree pulse RF signal and a 180-degree pulse RF signal based on the phase error (φ). As illustrated in FIG. 9, the phase (θ) of the 180-degree pulse is corrected with the value (φ) calculated from the linear function illustrated in FIG. 8. AO and DT are correction values calculated for each slice. Therefore, the pulse sequence is corrected with correction values different for each slice.

Correction of a first-order phase error in the readout direction is performed by adjusting the area of a gradient magnetic field for compensation based on the size of the correction value (TF). By adjusting the area of the gradient magnetic field for compensation, deviation of the echo center of an MR signal can be corrected. This correction is equivalent to correcting the area of the gradient magnetic field for compensation so as to match the area of the gradient magnetic field for compensation with a half of the area of the gradient magnetic field for readout based on the size of a phase shift caused by an eddy current and the like.

Thus, the pulse sequence executed in the main scan is corrected with the correction values calculated based on the phase error acquired in the prescan. However, as described before, to acquire the correction values, the pulse sequence same as the one executed in the main scan is executed in the prescan, which causes a problem that the entire imaging time is prolonged. Accordingly, the MRI apparatus 10 according to the present embodiment provides a technique that can reduce imaging time by calculating the magnitude relation of the correction values calculated as described before and determining whether or not the prescan is skippable in next imaging.

With reference again to the flowchart of FIG. 4, the operation is described again.

In ST103, the correction value determination function 373 executes correction value determination processing. The correction value determination processing is the processing performed by the correction value determination function 373 to determine magnitude relation of correction values calculated by the correction value calculation function 371. The size magnitude of the correction values is determined, for example, based on a threshold set for each correction value. The result of determining the magnitude relation of the correction values can be expressed with a binary digit. For example, when a correction value is larger than a threshold, the result may be expressed as "1", and when the correction value is smaller than the threshold, the result may be expressed as "0." The correction value determination processing is described in detail with reference to FIG. 10.

In ST105, the pulse sequence correcting function 377 generates a corrected pulse sequence based on the correction values acquired in the prescan.

In ST107, a main scan is executed based on the corrected pulse sequence and based on imaging conditions other than the pulse sequence set for the first imaging.

ST105 and ST107 may be executed immediately after the correction values are calculated in ST101.

Figure 10:
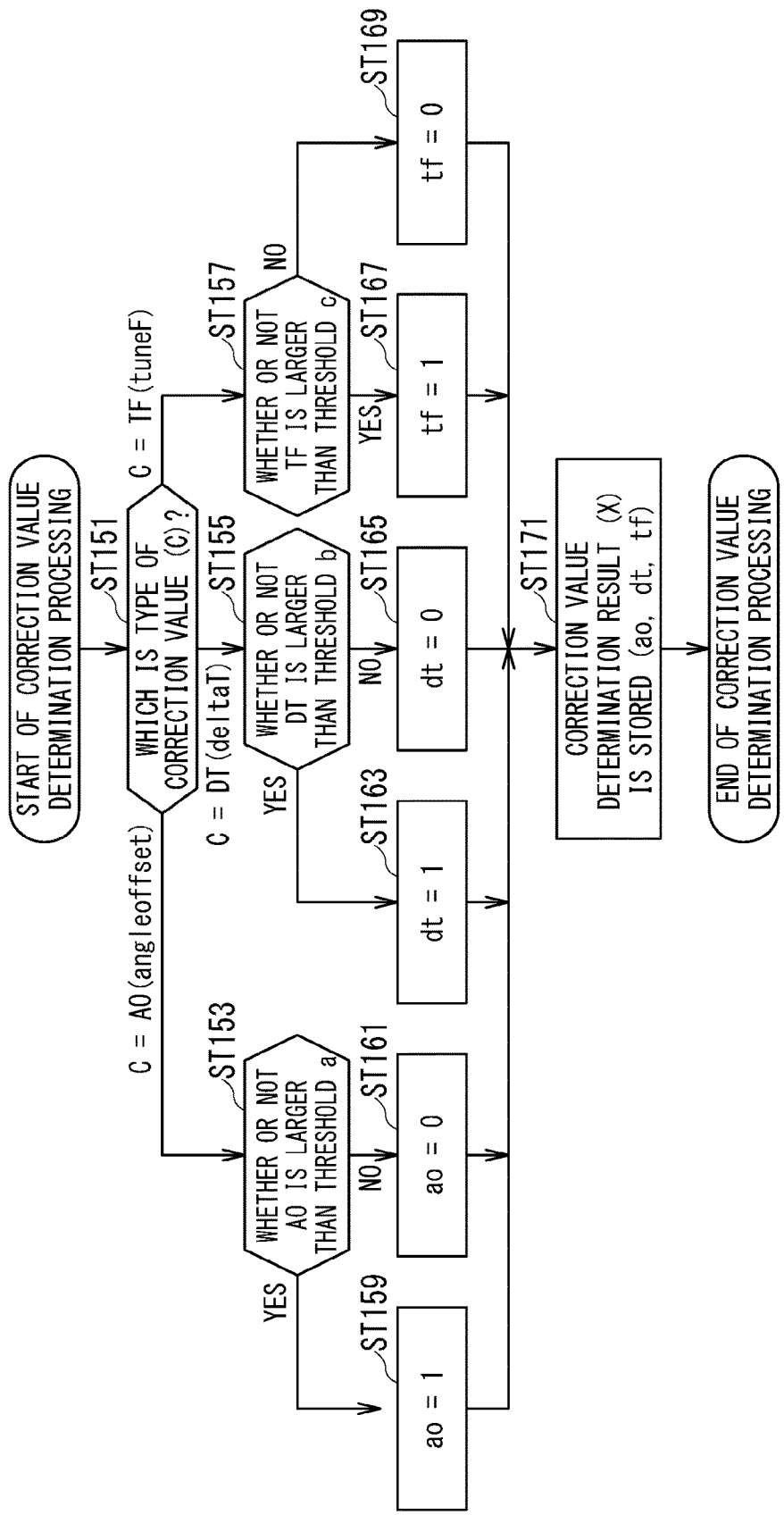
FIG. 10 is a flowchart illustrating one example of the correction value determination processing.

FIG. 10 is a flowchart illustrating one example of the correction value determination processing.

In ST151, the correction value determination function 373 acquires three correction values calculated by the correction value calculation function 371. The processing route is branched in accordance with the type of correction values (C). When the type of the correction value (C) is AO (Angle Offset), the processing proceeds to ST153. When the type of correction value (C) is DT (deltaT), the processing proceeds to ST155. When the type of correction value (C) is TF (TuneF), the processing proceeds to ST157.

In ST153, it is determined whether or not the correction value AO is larger than a given threshold a. When the correction value AO is larger than the threshold a (Yes), 1 is set in ao in ST159. When the correction value AO is smaller than the threshold a, (No), 0 is set in ao in ST161.

In ST155, it is determined whether or not the correction value DT is larger than a given threshold b. When the correction value DT is larger than the threshold b (Yes), 1 is set in dt in ST163. When the correction value DT is smaller than the threshold b (No), 0 is set in dt in ST165.

In ST157, it is determined whether or not the correction value TF is larger than a given threshold c. When the correction value TF is larger than the threshold c (Yes), 1 is set in tf in ST167. When the correction value TF is smaller than the threshold c (No), 0 is set in tf in ST169.

In ST171, the correction value determination function 373 generates a correction value determination result (X). The correction value determination result (X) is constituted of three values, ao, dt, and tf, which express the magnitude relation of three correction values AO, DT, and TF, respectively. For example, when the correction value AO is larger than the threshold a (ao=1), the correction value DT is smaller than the threshold b (dt=0), and the correction value TF is smaller than the threshold c (tf=0), X=(1, 0, 0) is obtained. The correction value determination result (X) generated in this way is stored in the determination result storage circuitry 341.

The correction value determination processing is executed through the above operation. In the first embodiment, when the first imaging is executed and then the second imaging is executed in a pulse sequence of the same type as in the first imaging as described before, it is determined whether or not the second prescan is reducible based on the correction value determination result (X) stored in the determination result storage circuitry 341.

Figure 11:
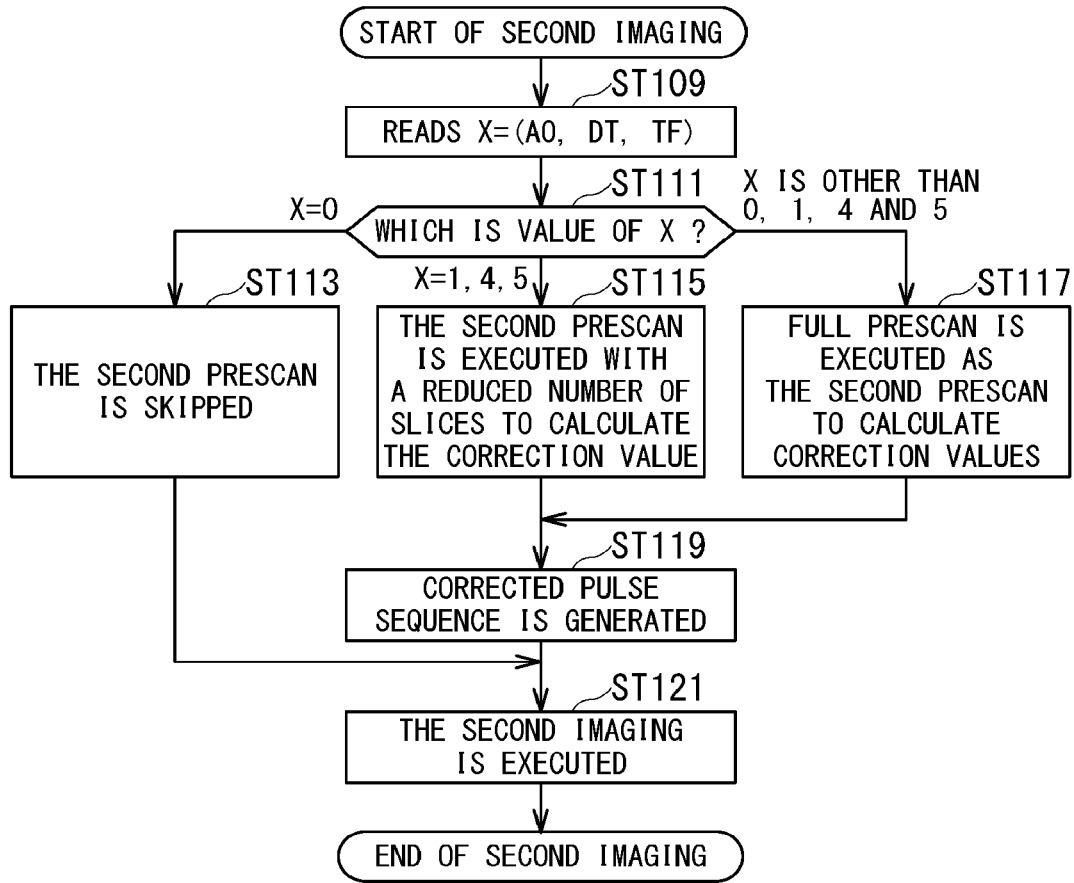
FIG. 11 is a flow chart of the second imaging illustrating one example of operation of the MRI apparatus according to the first embodiment.

FIG. 11 is a flow chart of the second imaging illustrating one example of operation of the MRI apparatus 10 according to the first embodiment.

In ST109, the prescan determination function 375 reads the correction value determination result (X) generated in the first imaging from the determination result storage circuitry 341.

In ST111, the processing is branched into ST113 to ST117 in accordance with the correction value determination result.

When correction value determination result is (X)=(0, 0, 0) in ST111, i.e., the correction value determination result (X) expressed by the binary number is equivalent to 0 in decimal expressions (when all the correction values of three types are smaller than specified thresholds), the second prescan is skipped in ST113. More specifically, when all the correction values calculated in the first prescan are smaller than the thresholds, it can be determined that calculation of correction values in the second prescan is unnecessary. Therefore, imaging time in the second imaging can be shortened by the time of prescan. In this case, the pulse sequence of the second imaging is corrected with the correction values calculated in the first prescan. Then, the second main scan is executed with the modified pulse sequence and imaging conditions other than the pulse sequence set for the second imaging (ST121).

When the correction value determination result (X) is 1, 4 or 5 in decimal expressions in ST111, i.e., the correction value determination result (X) is (0, 0, 1), (1, 0, 0) or (1, 0, 1) in binary expressions (when the correction value DT in the slice direction, among the correction values of three types, is smaller than a specified value), the second prescan is executed with a reduced number of slices to calculate the correction value in ST115. This pattern corresponds to the case where the correction value determination result dt is smaller than the threshold. The parameter dt represents the magnitude relation of the correction value DT for the first-order phase error in the slice direction. When the correction value for the first-order phase error in the slice direction is small, correction in the slice direction is simplified to reduce the time of the second prescan, so that the time of the entire second imaging can be reduced. Since the first-order correction value in the slice direction is obtained from a straight line as illustrated in FIG. 9, it is necessary to image at least two slices in the second prescan. The number of slices imaged in the second prescan may be preset or may be set by a user such as an inspecting engineer who uses the MRI apparatus 10. A larger digit number may be used to express the correction value determination result (dt) so as to determine the magnitude of the correction value in stages. More specifically, the correction value determination result dt may be divided into four stages of "extremely large" (10), "large" (11), "small" (01), and "extremely small" (00), and a reducible number of slices may be set for the respective stages. In this case, a corrected pulse sequence (for second imaging) is generated with correction values obtained in the reduced second prescan (ST119). Then, the second main scan is executed with the generated pulse sequence for the second imaging and with imaging conditions other than the pulse sequence set for the second imaging (ST121).

When it is determined in ST111 that the correction values are large, i.e., when the correction value determination result (X) is other than 0, 1, 4 and 5 in decimal expressions, a full prescan is executed as the second prescan to calculate correction values in ST117. The full prescan is the same as the first prescan, in which a prescan for calculating each of three correction values is executed, so that the correction values are calculated. In this case, with use of the correction values calculated in the second prescan performed as a full prescan, a corrected pulse sequence (for second imaging) is generated (ST119). The second main scan is executed with the generated pulse sequence for second imaging and with imaging conditions other than the pulse sequence set for the second imaging (ST121).

Whether or not to execute the second prescan may finally be determined by the user. That is, even when the second prescan is determined to be skipped, the user may select to execute the second prescan. Whether or not to perform determination of the second prescan according to the embodiment may also arbitrarily be set by the user at the start of imaging.

As described in the foregoing, in the first embodiment, the prescan for the second imaging is skippable based on the magnitude relation of the correction values acquired in the first prescan. The time of the prescan for the second imaging can also be reduced in accordance with the property of the acquired correction values. As a result, the imaging time of the second imaging repeatedly performed after installation can be reduced as a whole.

Second Embodiment

In addition to the first embodiment, the second embodiment relates to determination of a method of reducing the time of the second prescan based on similarity in imaging conditions in the second imaging.

(1) Configuration

Figure 12:
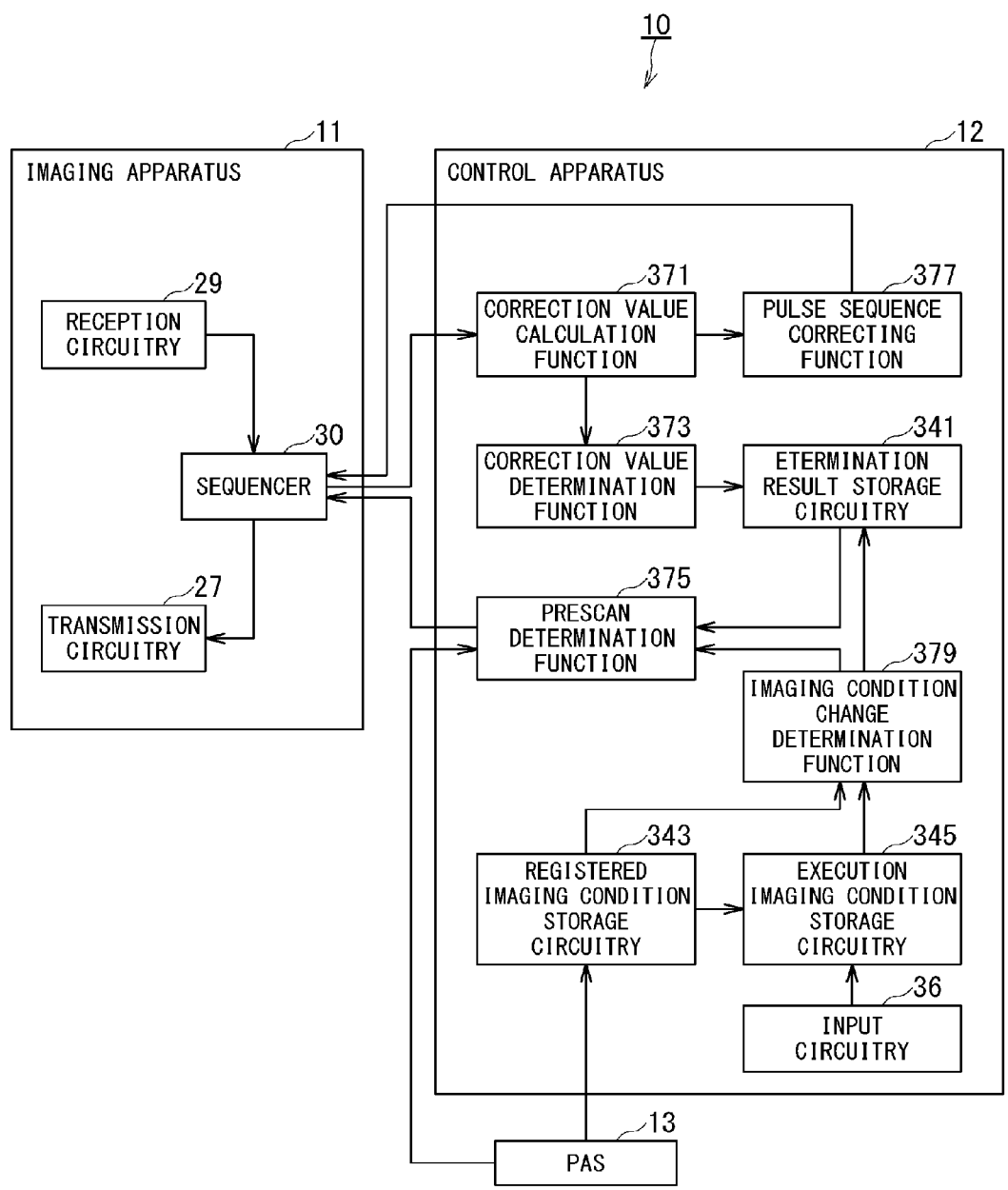
FIG. 12 is a functional block diagram illustrating a functional configuration example of an MRI apparatus according to the second embodiment

FIG. 12 is a functional block diagram illustrating a functional configuration example of an MRI apparatus 10 according to the second embodiment. The functional blocks similar to those in the first embodiment are designated by similar reference signs to omit the description thereof.

As illustrated in FIG. 12, the second embodiment includes, in addition to the first embodiment, an imaging condition change determination function 379, registered imaging condition storage circuitry 343, and execution imaging condition storage circuitry 345. Among these functions, the imaging condition change determination function 379 is implemented when a program stored in the memory circuitry 34 is executed by the processing circuitry 37 that includes a processor.

The registered imaging condition storage circuitry 343 stores registered imaging conditions including pulse sequences preset for each anatomical region. The registered imaging conditions include the pulse sequences stored in the PAS 13. The registered imaging condition storage circuitry 343 stores the pulse sequences and the like selected from the PAS 13 in accordance with the imaging conditions and the anatomical regions specified by the user and the like at the time of imaging.

The execution imaging condition storage circuitry 345 stores the execution imaging conditions prepared based on the registered imaging conditions. The execution imaging conditions are imaging conditions used in actual imaging of the object P. When the user and the like changes the imaging conditions based on the registered imaging conditions including the pulse sequences stored in the PAS 13, the changed imaging conditions are used as the execution imaging conditions. When the imaging conditions are not changed, then the registered imaging conditions are used as the execution imaging conditions without any change. The user can change the imaging conditions including, the number of steps in the phase encoding, the number of steps in the readout direction, the number and thickness of slices (hereinafter referred to as resolution), the position of an imaging center (offset value), TR intervals or the number of 180-degree pulses (ETL), and allocation of gradient magnetic fields (i.e., adjustment in the slice direction by adjustment of the magnetic field intensities of the gradient magnetic fields in three axis directions). When at least one of these imaging conditions is changed, the influence of the eddy current in the pulse sequence is changed, so that phase errors caused thereby also differ.

Based on the similarity between registered imaging conditions and execution imaging conditions, the imaging condition change determination function 379 determines whether the similarity is large or small, and generates a change determination result. Whether or not the first imaging and the second imaging are based on the pulse sequence of the same type is determined based on the registered imaging conditions. The execution imaging conditions are changed by the user in each imaging based on the registered imaging conditions. The imaging condition change determination function 379 determines the similarity between the registered imaging conditions and the execution imaging conditions changed by the user. The similarity may be determined based on, for example, whether a difference between individual parameters or between important parameters in that imaging in the registered imaging conditions and the execution imaging conditions is large or small, or may be determined in accordance with the correlation between the parameters as a whole. Specifically, the similarity may be determined based on one of the imaging conditions changed by the users, such as the position of the imaging center or resolution, or may be determined based on the imaging conditions with a large change amount, among the respective imaging conditions. The similarity may also comprehensively be determined by combining each of the change amounts. The size of the change amount may be determined based on preset thresholds as in the case of determining the magnitude relation of the correction values.

(2) Operation

Hereinafter, the operation of the second embodiment will be described. In the second embodiment, operation of the second imaging will be described. The second imaging is implemented by using a pulse sequence of the same type as that in the first imaging described in FIG. 4 after the first imaging is executed. Using a pulse sequence of the same type indicates using the same pulse sequence that is stored in the PAS 13 or that is read from the PAS 13 and stored in the registered imaging condition storage circuitry 343.

Figure 13:
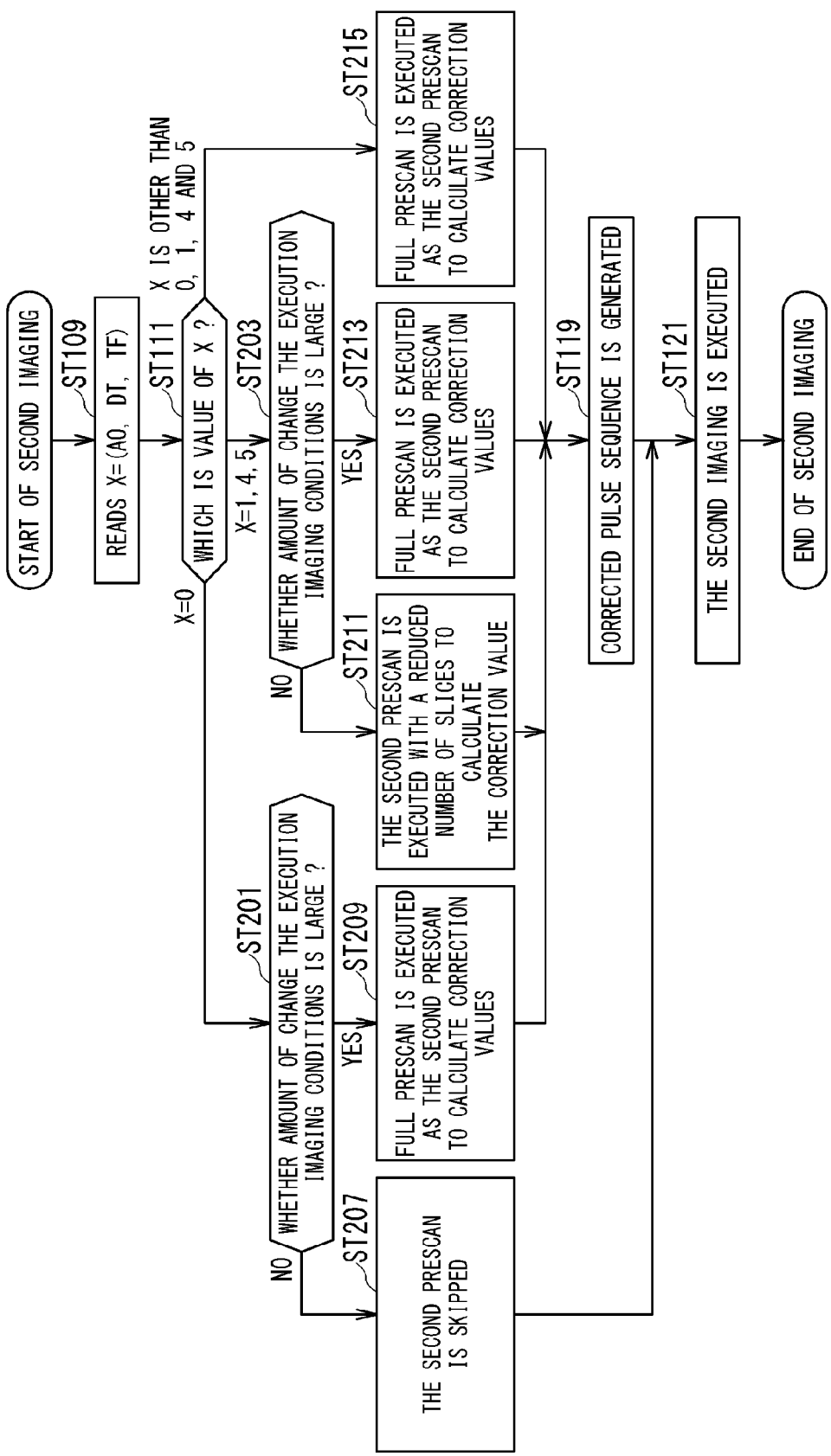
FIG. 13 is a flow chart of the second imaging illustrating one example of operation of the MRI apparatus according to the second embodiment.

FIG. 13 is a flow chart of the second imaging illustrating one example of operation of the MRI apparatus 10 according to the second embodiment. Operation steps identical to those in the first embodiment described in FIG. 10 are designated by identical reference signs to omit the description thereof.

When a correction value determination result is (X)=(0, 0, 0) in ST111, i.e., when the correction value determination result (X) expressed by the binary number is 0 in decimal expressions, the imaging condition change determination function 379 determines the similarity between registered imaging conditions and execution imaging conditions in ST201. In the example of FIG. 13, the similarity is determined based on the amount of change from the registered imaging conditions to the execution imaging conditions. When the change amount is smaller than a given threshold (No), the second prescan is skipped in ST207. More specifically, when the amount of change from the registered imaging conditions to the execution imaging conditions is small, the second prescan is skipped, so that the entire imaging time can be reduced. On the contrary, when the amount of change from the registered imaging conditions to the execution imaging conditions is large (Yes), a full prescan is executed in the second prescan, and correction values are calculated in ST209. Even when the correction values measured based on the pulse sequence set under the registered imaging conditions in the first imaging are small, it is necessary to reacquire correction values if the amount of change from the same registered imaging conditions to the execution imaging conditions is large in the second imaging.

When the correction value determination result (X) is 1, 4 or 5 in decimal expressions in ST111, i.e., when the correction value determination result (X) is (0, 0, 1), (1, 0, 0) or (1, 0, 1) in binary expressions, the imaging condition change determination function 379 determines the amount of change from the registered imaging conditions to the execution imaging conditions in ST203 as in the case of ST201. When the change amount is smaller than a given threshold (No), the second prescan is executed with a reduced number of slices to calculate correction values in ST211. When the change amount is larger than the given threshold (Yes), a full prescan is executed as the second prescan in ST213 to calculate correction values.

When it is determined in ST111 that the correction values are large, i.e., when the correction value determination result (X) is other than 0, 1, 4 and 5 in decimal expressions, a full prescan is executed as the second prescan in ST215 to calculate correction values without performing determination of the amount of change from the registered imaging conditions to the execution imaging conditions.

The processing of ST119 and ST121 is the same as that in the first embodiment, and therefore the description thereof is omitted.

As described in the foregoing, whether the second prescan is skippable or reducible is determined in accordance with the amount of change from the registered imaging conditions to the execution imaging conditions, so that the entire imaging time can be reduced.

Third Embodiment

In addition to the second embodiment, the third embodiment relates to determining the magnitude relation of the correction values acquired in the second prescan and storing the determination result together with changed imaging conditions.

Since the third embodiment is identical in configuration to the second embodiment described in FIG. 12, the description thereof is omitted.

(1) Operation

Hereinafter, the operation of the third embodiment will be described. In the third embodiment, as in the second embodiment, the second imaging is performed, which is implemented by using a pulse sequence of the same type as that of the first imaging described in FIG. 4, after the first imaging is executed.

Figure 14:
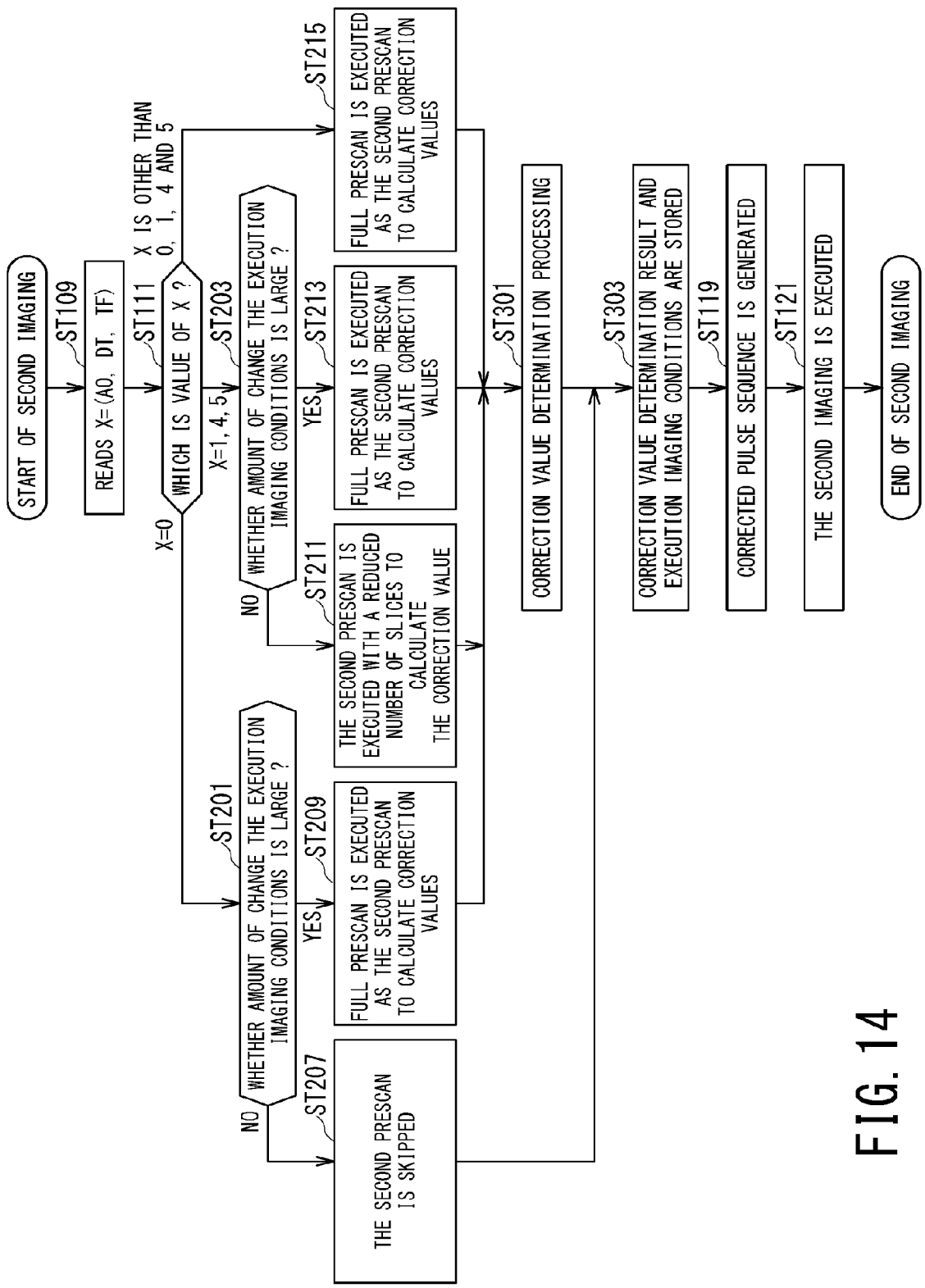
FIG. 14 is a flow chart of the second imaging as one example of operation of the MRI apparatus according to the third embodiment.

FIG. 14 is a flow chart of the second imaging as one example of operation of the MRI apparatus according to the third embodiment. Operation steps identical to those in the second embodiment are designated by identical reference signs to omit the description thereof.

In ST301, correction value determination processing is executed. The correction value determination processing itself is the same as the processing described in FIG. 10. In ST301, the correction value determination function 373 generates a correction value determination result based on the correction values acquired in the full prescan executed as a second prescan and in the second prescan with a reduced number of slices. The correction value determination result in the second prescan is expressed as X1, and the correction value determination result in the first prescan is expressed as X0.

In ST303, a combination of the correction value determination result and the execution imaging conditions are stored in the determination result storage circuitry 341. When the second prescan is executed, the correction value determination result (X1) calculated in ST301 for the correction values based on the second prescan and the execution imaging conditions are stored. When the second prescan is skipped, the correction value determination result (X0) generated in the first imaging and the execution imaging conditions are stored.

The combination of the correction value determination result and the execution imaging conditions stored in the determination result storage circuitry 341 is stored for each imaging and are stored as a log. When it is determined based on the information accumulated in this way that the execution imaging conditions of imaging to be newly executed match with the stored execution imaging conditions, a corresponding correction value determination result can be used. Thus, by storing the correction value determination results and the execution imaging conditions in combination, the processing in the second imaging in the pulse sequence of the same type can be accelerated. More specifically, when the imaging conditions of one imaging are changed in the same way as in another imaging executed in the past, it is possible to use the corresponding correction value determination result to determine whether or not the prescan is reducible in the processing same as the operation in the second imaging illustrated in FIG. 10 under the changed imaging conditions.

Note that the correction value determination results are largely dependent on a system. Therefore, the correction value determination results are deleted when replacement of coils and drastic update of the system are carried out. In the case of porting the execution imaging conditions to another terminal, only the execution imaging conditions are ported to another terminal so that the correction value determination results are not taken over.

Fourth Embodiment

Figure 15:
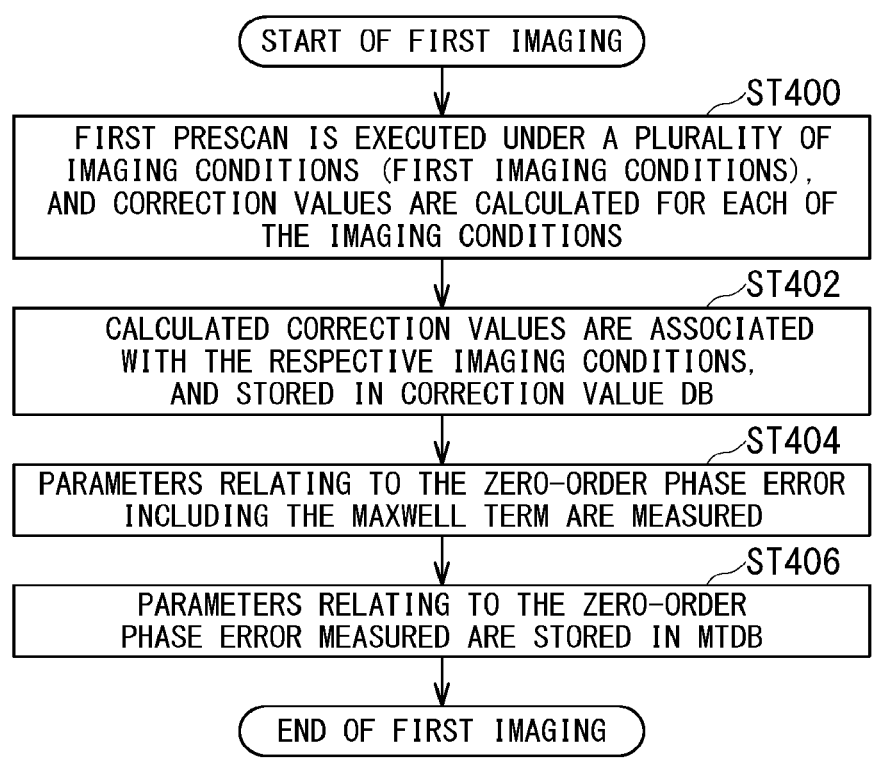
FIG. 15 is a flow chart illustrating processing example of the first imaging in the fourth embodiment.

In the fourth embodiment, imaging condition parameters set for clinical imaging (second imaging) are compared with predefined determination criteria, and whether or not to skip the second prescan is determined based on the comparison result regardless of the magnitude relation of the correction values. FIG. 15 is a flow chart illustrating processing example of the first imaging in the fourth embodiment.

In the first imaging in the fourth embodiment, a first prescan is executed under a plurality of imaging conditions (first imaging conditions), and correction values are calculated for each of the imaging conditions in ST400. The types of the correction values to be calculated and the method of calculating the correction values themselves are basically identical to those in the first to the third embodiments. That is, a correction value DT for correcting the phase error of the first-order component in the slice direction, a zero-order phase error AO for each slice necessary for calculating the correction value DT, and a correction value TF for correcting the first-order phase error in the readout direction are calculated for each of the plurality of imaging conditions. The purpose of performing the prescan under a plurality of imaging conditions is to acquire correction values in advance for each of the imaging conditions. The prescan is performed while imaging condition parameters, which have large influence on the correction values, such as a band width and ETS, are varied. In ST402, the calculated correction values are associated with the respective imaging conditions, and stored in a specified database (for example, the database is called a correction value DB). The first prescan is performed on a phantom at the time of installation of the apparatus and the like as in the case of the first to third embodiments.

In ST404, the parameters relating to the zero-order phase error including the Maxwell term are measured. The phase error relating to the Maxwell term is a parameter relating to zero-order phase correction like AO (Angle Offset) in the first to third embodiments. This measurement is also performed on a phantom. The phase error attributed to the Maxwell term is generated by a magnetic field (Maxwell Term) subordinately produced when a certain gradient magnetic field is applied. In ST404, the parameter relating to this phase error is measured. In ST406, the parameters relating to the zero-order phase error including the Maxwell term (Maxwell Term) measured in ST404 are stored in a specified database (for example, a database called MTDB), and the first imaging is ended.

Figure 16:
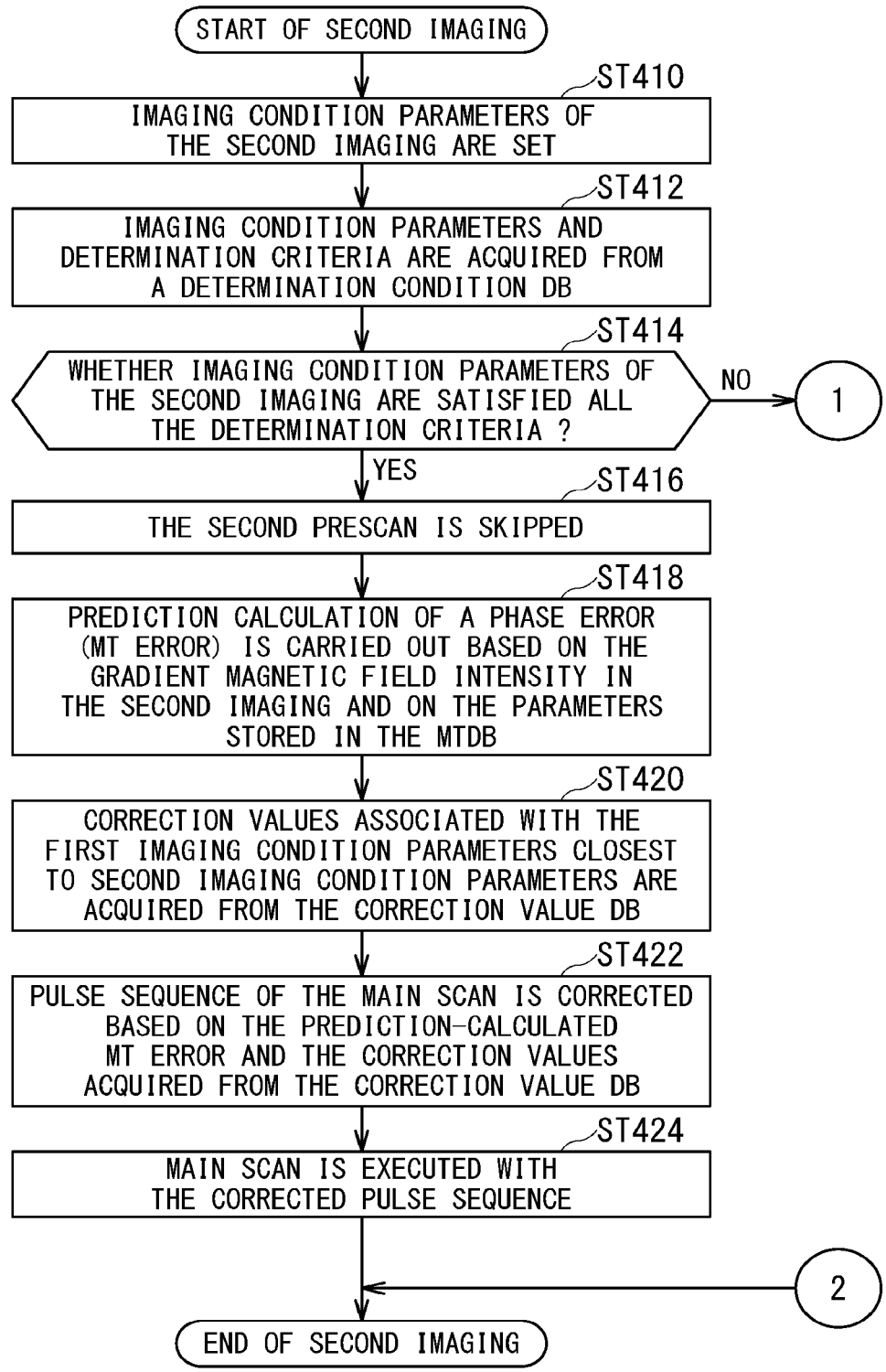
FIG. 16 is a flow chart illustrating a processing example of the second imaging in the fourth embodiment.
Figure 17:
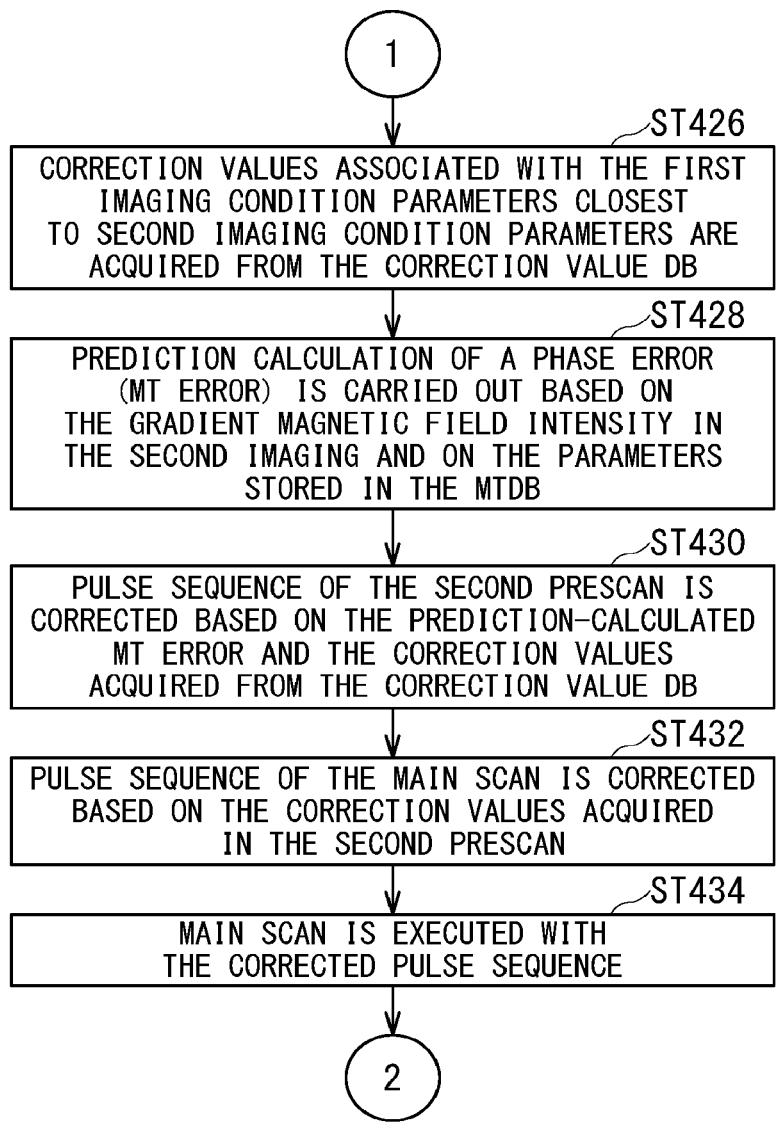
FIG. 17 is a flow chart illustrating a processing example of the second imaging in the fourth embodiment.

FIGS. 16 and 17 are a flow charts illustrating a processing example of the second imaging in the fourth embodiment. Also in the fourth embodiment, the second imaging is clinical imaging which is performed whenever imaging of a patient is performed. First, the imaging condition parameters of the second imaging are set in ST410. In this case, the imaging condition parameters include both specific types of the imaging condition parameters, such as the number of slices and slice thickness, and numerical values of the parameters, such as the slice number of 10, and slice thickness of 0.5 mm.

Next, in ST412, imaging condition parameters and determination criteria are acquired from a determination condition database (determination condition DB). Herein, the determination criteria are criteria for determining whether or not to skip the second prescan in the second imaging. The determination criteria are predefined for every imaging condition parameter and are stored in the determination condition DB. When the amount of change is large between the first imaging and the second imaging, the imaging condition parameters having a large influence on the phase correction values are selected. Hereinafter, one example of the imaging condition parameters and the determination criteria are described. The determination criteria are double-quoted.

(a) Offset position from magnetic field center. "The second prescan is skipped when a difference (offset) between the center position of second imaging and the center of the magnetic field is ±5 centimeters or less".

(b) Resolution (FOV, matrix size, slice thickness). "The second prescan is skipped when the slice thickness is 0.5 millimeter or more and FOV is 20 centimeters or more in second imaging."

(c) Prepulse information (presence/absence of fat saturation pulse, reversal pulse, presaturation pulse and the like). "The second prescan is skipped when the second imaging does not use a prepulse."

(d) Imaging region. "The second prescan is skipped when the target region of the second imaging is other than the wrist and the ankle which are frequently imaged at high resolution."

The above-stated criteria are merely an example for the sake of description, and the present invention is not limited thereto.

Next, in ST414, it is determined whether or not the imaging condition parameters set for the second imaging meet the determination criteria predefined in the determination condition DB. The second prescan is skipped if all the determination criteria are satisfied (ST416).

In ST418, prediction calculation of a phase error relating to the Maxwell term (hereinafter referred to as MT error) is carried out based on the gradient magnetic field intensity in the second imaging and on the parameters stored in the MTDB. Furthermore, in ST420, the correction values associated with the first imaging condition parameters closest to second imaging condition parameters are acquired from the correction value DB. Then, in ST422, the pulse sequence of the main scan (second main scan in the second imaging) is corrected based on the prediction-calculated MT error and the correction values acquired from the correction value DB. Finally, the main scan is executed with the corrected pulse sequence (ST424), and the second imaging is ended.

When it is determined in ST414 that the imaging condition parameters set for the second imaging do not meet one or more determination criteria predefined in the determination condition DB, a prescan (second prescan) is executed also in the second imaging.

Also in this case, as in ST420, the correction values associated with the first imaging condition parameters closest to the second imaging condition parameters are acquired from the correction value DB (ST426). As in ST418, prediction calculation of a phase error relating to the Maxwell term (referred to as MT error) is carried out based on the gradient magnetic field intensity in the second imaging and on the parameters stored in the MTDB (ST428).

Then, in ST430, the second prescan is executed. The second prescan is executed in a pulse sequence obtained by correcting the pulse sequence set for the second imaging (second main scan) based on the correction values acquired from the correction value DB and on the calculated MT error. For execution of the second prescan, a plurality of prescan modes may be prepared in accordance with correction accuracy, and one prescan mode may automatically or manually be selected from the plurality of prescan modes. For example, the plurality of prescan modes may be three modes including first to third modes. For example, the first mode may be defined as a standard mode which may fail to offer sufficient correction accuracy in high resolution imaging or off-center imaging but has shortest scan time. The second mode can offer sufficient correction accuracy in high resolution imaging or off-center imaging but has longer scan time than the first mode. The third mode is defined as a mode corresponding to imaging with high resolution in the phase encoding direction, such as imaging of regions with small FOV such as the wrist, the shoulder, and the ankle, and imaging of the head.

In ST432, the pulse sequence of the main scan (second main scan) is corrected based on the correction values acquired in the second prescan. Then, in ST434, the main scan is executed with the corrected pulse sequence, and the second imaging is ended. The second prescan may be executed in substantially the same sequence as the pulse sequence set for the second imaging (second main scan), and the pulse sequence of the second main scan may collectively be corrected based on the prediction-calculated MT error, the correction values acquired from the correction value DB, and the correction values acquired in the second prescan.

Each of the processing of ST400 to ST406 illustrated in FIG. 15, and each of the processing of ST410 to ST434 illustrated in FIGS. 16 and 17 are implemented when, for example, specified programs stored in the memory circuitry 34 (see FIG. 1) are executed by the processor included in the processing circuitry 37 (see FIG. 1).

The MRI apparatus 10 in the fourth embodiment is configured so that imaging condition parameters set for clinical imaging (second imaging) are compared with the determination criteria predefined in advance, and the prescan in the second imaging is skipped (omitted) when the determination criteria are satisfied. As a result, the imaging time of the second imaging is reduced as a whole.

The MRI apparatus according to at least one of the embodiments disclosed can reduce imaging time.

The processing circuitry in the above-described embodiments is an example of the processing circuitry described in the claims.

The term "processor" in the above-described embodiments means, for instance, a circuit such as a special-purpose or general-purpose CPU (Central Processing Unit), a special-purpose or general-purpose GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array).

A processor implements various types of functions by reading out programs stored in a memory circuit and executing the programs.

In addition, programs may be directly installed in the circuit of the processor instead of storing the programs in a separate memory circuit. In this case, the processor implements various types of functions by reading out programs installed in its circuit and executing these programs.

Although a case where unified processing circuitry implements respective functions has been described in the above-described embodiments, the processing circuitry may be configured by combining plural processors being independent of each other so that each of the processers implements each function by executing the corresponding program.

Furthermore, when plural processors are provided, memory media for storing programs may be provided for the respective processors or one memory medium may collectively store all the programs corresponding to the functions of each processor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An MRI apparatus, comprising:
a static magnetic field magnet configured to generate a static magnetic field;
a gradient coil configured to generate a gradient magnetic field;
a transmission and reception coil configured to transmit an RF signal and receive a magnetic resonance signal; and
processing circuitry configured to
set an imaging condition of a diagnostic scan,
determine whether or not a prescan is skippable or reducible based on the set imaging condition of the diagnostic scan, wherein the prescan is performed to obtain data for calculating a correction value that corrects a phase error of the diagnostic scan, and the diagnostic scan is performed to obtain a diagnostic image after the prescan, and
execute the diagnostic scan without the prescan or with the reduced prescan, when it is determined that the prescan is skippable or reducible based on the imaging condition of the diagnostic scan.

2. The MRI apparatus according to claim 1, wherein the processing circuitry is further configured to determine whether the prescan is skippable or reducible, in accordance with a similarity between the imaging condition of the diagnostic scan and a specified imaging condition.

3. The MRI apparatus according to claim 2, wherein the processing circuitry is further configured to determine whether the prescan is skippable or reducible in accordance with at least one of a similarity between a center of the diagnostic scan and a magnetic field center, a similarity in a parameter relating to resolution, and a similarity relating to a prepulse.

4. The MRI apparatus according to claim 1, further comprising
a memory that stores a correction value corresponding to a specified imaging condition, wherein
the processing circuitry is further configured to use the imaging condition of the diagnostic scan to refer to the correction value corresponding to the imaging condition in the memory and determine whether the prescan is skippable in accordance with a size of the correction value.

5. An MRI apparatus, comprising:
a static magnetic field magnet configured to generate a static magnetic field;
a gradient coil configured to generate a gradient magnetic field;
a transmission and reception coil configured to transmit an RF signal and receive a magnetic resonance signal;
processing circuitry; and
a memory that stores, for each type of correction value that corrects the phase error, a correction value acquired by a first prescan performed at a time of installation of the MRI apparatus, wherein
the processing circuitry is configured to
determine whether a second prescan, which is performed prior to a diagnostic scan for obtaining a diagnostic image, is skippable or reducible based on the stored correction value, and
execute the diagnostic scan without the second prescan or with the reduced second prescan, when it is determined that the second prescan is skippable or reducible based on the stored correction value.

6. The MRI apparatus according to claim 5, wherein the processing circuitry is further configured to determine whether the prescan is skippable or reducible in accordance with a similarity between an imaging condition of the diagnostic scan and a specified imaging condition.

7. The MRI apparatus according to claim 6, wherein the processing circuitry is further configured to determine whether the prescan is skippable or reducible in accordance with at least one of a similarity between a center of the diagnostic scan and a magnetic field center, a similarity in a parameter relating to resolution, and a similarity relating to a prepulse.

8. The MRI apparatus according to claim 5, wherein the memory stores a changed imaging condition that is changed based on the correction value, together with the correction value, and the processing circuitry is further configured to determine whether the prescan is skippable or reducible based on the correction value corresponding to the changed imaging condition, when executing a scan including at least the diagnostic scan using the changed imaging condition.

9. The MRI apparatus according to claim 1, wherein the processing circuitry is further configured to:
   when the prescan is skipped, execute the diagnostic scan corrected with all the correction values acquired before the prescan; and
   when the prescan is reduced, execute the diagnostic scan corrected with the correction values acquired in the reduced prescan and with part of the correction values acquired the before the prescan.

10. The MRI apparatus according to claim 5, wherein the processing circuitry is further configured to:
    when the prescan is skipped, execute the diagnostic scan corrected with all the correction values acquired before the prescan; and
    when the prescan is reduced, execute the diagnostic scan corrected with the correction values acquired in the reduced prescan and with part of the correction values acquired the before the prescan.

11. The MRI apparatus according to claim 5, wherein the types of correction values include:
    a correction value that corrects a zero-order phase error in a readout direction;
    a correction value that corrects a first-order phase error in a slice direction; and
    a correction value that corrects a first-order phase error component in the readout direction.

12. The MRI apparatus according to claim 1, wherein the processing circuitry is further configured to execute the diagnostic scan with a reduced number of slices, when the prescan is reduced.

13. The MRI apparatus according to claim 5, wherein the processing circuitry is further configured to execute the diagnostic scan with a reduced number of slices, when the prescan is reduced.

* * * * *